(12) United States Patent
Honda

(10) Patent No.: US 8,243,537 B2
(45) Date of Patent: Aug. 14, 2012

(54) SEMICONDUCTOR MEMORY

(75) Inventor: Satofumi Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 231 days.

(21) Appl. No.: 12/836,656

(22) Filed: Jul. 15, 2010

(65) Prior Publication Data

US 2011/0019490 A1   Jan. 27, 2011

(30) Foreign Application Priority Data

Jul. 21, 2009   (JP) .................. 2009-170574

(51) Int. Cl.
*G11C 7/00* (2006.01)
*G11C 5/02* (2006.01)

(52) U.S. Cl. ........................ 365/200; 365/51
(58) Field of Classification Search .................. 365/200
See application file for complete search history.

(56) References Cited

U.S. PATENT DOCUMENTS

| | | | | |
|---|---|---|---|---|
| 6,191,983 B1* | 2/2001 | Kitsukawa et al. | ........... | 365/200 |
| 6,496,430 B2* | 12/2002 | Aikawa et al. | ............ | 365/200 |
| 8,072,827 B2* | 12/2011 | Wakimoto | ............ | 365/200 |
| 8,159,890 B2* | 4/2012 | Fujiwara | ............ | 365/200 |

FOREIGN PATENT DOCUMENTS

| | | |
|---|---|---|
| JP | 1-213900 | 8/1989 |
| JP | 6-36592 | 2/1994 |

* cited by examiner

*Primary Examiner* — Son Mai

(74) *Attorney, Agent, or Firm* — Staas & Halsey LLP

(57) ABSTRACT

A semiconductor storage device includes a memory cell array that stores data and includes a plurality of memory cells two dimensionally arrayed on row and column lines extending along row and column directions, at least one of the memory cells assigned to a redundant memory cell having a larger area size than the other memory cells, the plurality of memory cells and at least one of the redundant memory cells arrayed on at least one of the row lines.

9 Claims, 21 Drawing Sheets

11
T11 TO T13, T21 TO T23

12
T11 TO T13, T21 TO T23

FIG. 16A CLK 
FIG. 16B ADS 
FIG. 16C WL 
FIG. 16D CS 
FIG. 16E RNL 
FIG. 16F RNR 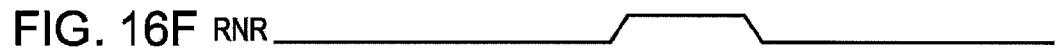
FIG. 16G SAE 
FIG. 16H BL 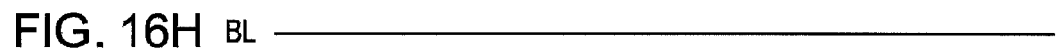
FIG. 16I XBL 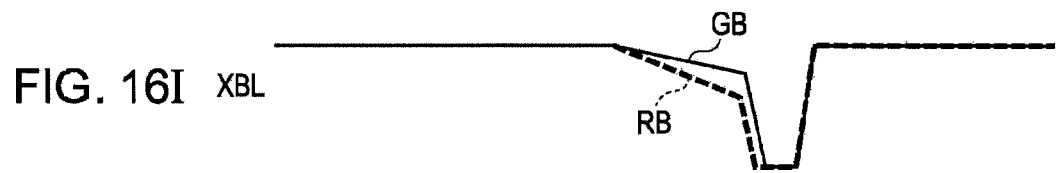
FIG. 16J RD 

FIG. 17A CLK 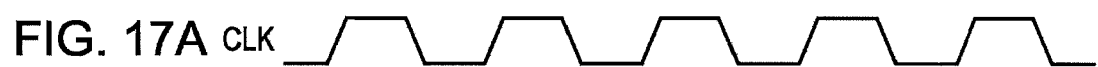
FIG. 17B ADS 
FIG. 17C WD 
FIG. 17D WL 
FIG. 17E CS 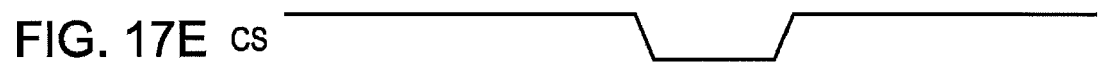
FIG. 17F BL / XBL 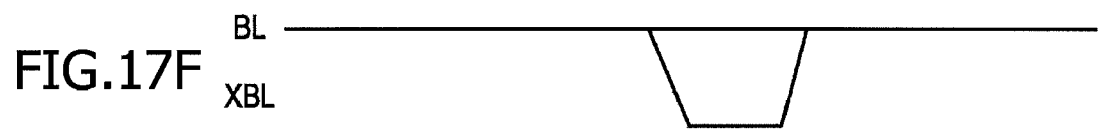

SEMICONDUCTOR MEMORY

CROSS-REFERENCE TO RELATED APPLICATION

This application is based upon and claims the benefit of priority of the prior Japanese Patent Application No. 2009-170574 filed on Jul. 21, 2009, the entire contents of which are incorporated herein by reference.

FIELD

The embodiment of the present invention discussed herein relates to a semiconductor memory.

BACKGROUND

Semiconductor memories have been known each of which contains alternative redundant memory cells provided in the row direction, in addition to memory cells normally used in system operations. In such a semiconductor memory, a redundant memory cell has a larger area than a normal memory cell. An alternative redundant memory cell and a defective normal memory cell are selected double. In the configuration, since a redundant memory cell has a larger area than a normal memory cell, correct data of the redundant memory cell is output even when the normal memory cell and the redundant memory cell are selected double.

Semiconductor memories with a redundant circuit have also been known which connect a high-sensitivity sense amplifier containing a transistor having a high drivability which is higher than the drivability of a sense amplifier used for a normal memory cell array to a spare cell in a spare row.

When the redundant memory cells are provided in the row direction as described above, the area of the corresponding sense amplifier may be increased with the increase in area of the redundant memory cells. As a result, the areas of the sense amplifiers increase in all columns. This may largely influence on a size of the area of the entire semiconductor memory.

In semiconductor memories with a redundant circuit, high sensitivity sense amplifiers may be provided to all spare cells in a spare row. This largely influence on a size of the entire area of the semiconductor memory.

The followings are a reference documents.
[Patent Document 1] Japanese Laid-open Patent Publication No. 06-36592
[Patent Document 2] Japanese Laid-open Patent Publication No. 01-213990

SUMMARY

According to an aspect of an embodiment, a semiconductor storage device includes a memory cell array that stores data and includes a plurality of memory cells two dimensionally arrayed on row and column lines extending along row and column directions, at least one of the memory cells assigned to a redundant memory cell having a larger area size than the other memory cells, the plurality of memory cells and at least one of the redundant memory cells arrayed on at least one of the row lines, and a plurality of sense amplifiers that amplify a first output signal from the memory cells, at least one of the sense amplifiers arrayed on the respective column lines, at least one of the sense amplifiers assigned to a redundant sense amplifier that amplifies a second output signal from the redundant memory cell having a larger area size than the other sense amplifiers, the plurality of sense amplifiers and at least one of the redundant sense amplifiers arrayed on at least one of the row lines.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 16A to 16J are timing charts in data reading in a semiconductor memory according to an embodiment;

FIGS. 17A to 17G are timing charts in data writing in a semiconductor memory according to an embodiment;

DESCRIPTION OF EMBODIMENTS

With reference to drawings, embodiments will be described in detail below.

Figure 1:
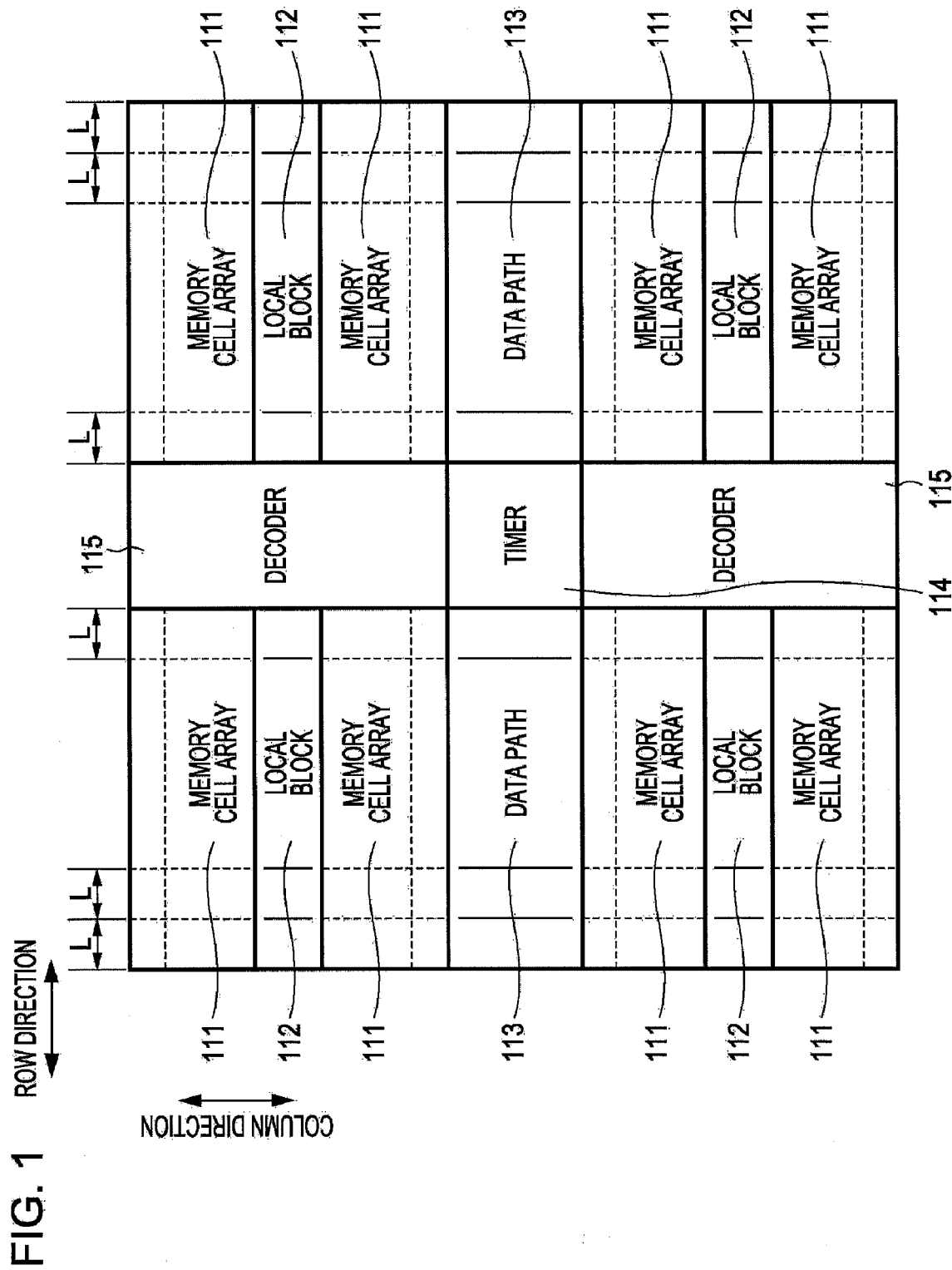
FIG. 1 is a schematic layout diagram of a semiconductor memory.

FIG. 1 illustrates a schematic diagram of a static random access memory (SRAM) macro functioning as a semiconductor memory. The SRAM macro refers to a circuit block functioning as an SRAM.

The SRAM macro in FIG. 1 includes memory cell arrays 111, local blocks 112, data paths 113, a timer 114 and decoders 115. In each of the memory cell arrays 111, memory cells 11 (not illustrated in FIG. 1) are arranged two-dimensionally in the row and column directions. As illustrated in FIG. 1, the row direction of the memory cell arrays 111 is the horizontal direction while the column direction is the vertical direction. Therefore, in the memory cell array 111, a series of memory cells 11 aligned in the horizontal direction are memory cells 11 in a row while a series of memory cells 11 aligned in the vertical direction is memory cells 11 in a column. For convenience of illustration, FIG. 1 only illustrates a part of the memory cells 11 contained in the memory cell arrays 111. The other memory cells 11 are not illustrated in FIG. 1. The lengths in the row direction of the memory cells 11 are uniformly L, and the memory cells 11 also have a uniform length in the column direction.

The timer 114 performs operation control over the entire SRAM macro. The timer 114 receives control signals and address signals from external circuits of the timer 114. In accordance with a control signal and address signal, the timer 114 may switch between the ON and OFF states of the SRAM macro, adjust the operating timing or designate a memory cell 11 from or to which data is to be read or written, for example. The decoders 115 transmit a write enable signal to the corresponding local block 112 in accordance with a control signal from the timer 114. The write enable signal enables reading data from a designated memory cell 11 or writing data to a designated memory cell 11. The data paths 113 control external input/output to/from the SRAM macro on data read from memory cells 11 and data to be written to memory cells 11. In reading data from memory cells 11, the corresponding local block 112 controls so as to determine a signal acquired from the memory cell array 111 from the sense amplifier (not illustrated). Then, the corresponding local block 112 transmits the signal to the corresponding data path 113. In writing data to a memory cell 11, the corresponding local block 112 controls so as to transmit the data received from the data path 113 to the memory cell array 111. Then, the corresponding local block 112 controls so as to write the data to the corresponding memory cell 11. In memory cell arrays 111, data are written to memory cells 11 being the target of the data writing on the basis of the signals received from the decoders 115 and local blocks 112. Moreover, data are read from memory cells 11 being the target of the data writing. In other words, an address signal designating the memory cell 11 being the target of the data reading or writing is transferred from the timer 114 to the decoder 115. Then, the decoder 115 decodes the transferred address signal. As a result, the memory cell 11 is accessed.

The SRAM macro in FIG. 1 may include an alternative redundant memory cell (not illustrated) provided for a defective memory cell 11 in a memory cell array 111. The redundant memory cells may be built in the row direction in the memory cell arrays 111 and be connected via special word lines, for example. In addition, as described above, correct data in the redundant memory cell may be output when the area of the redundant memory cell is larger than normal memory cells and a redundant memory cell and a defective normal memory cell are selected double. In this way, providing redundant memory cells in the row direction of the memory cell array 110 and increasing the area of the redundant memory cells and thus the area of all corresponding sense amplifiers as described above may largely influence on the area of the semiconductor memory.

In view of the problem, the following embodiments are configured to improve the yield of semiconductor memories, improve the working velocity and provide uniform characteristics in an entire semiconductor memory.

Figure 2:
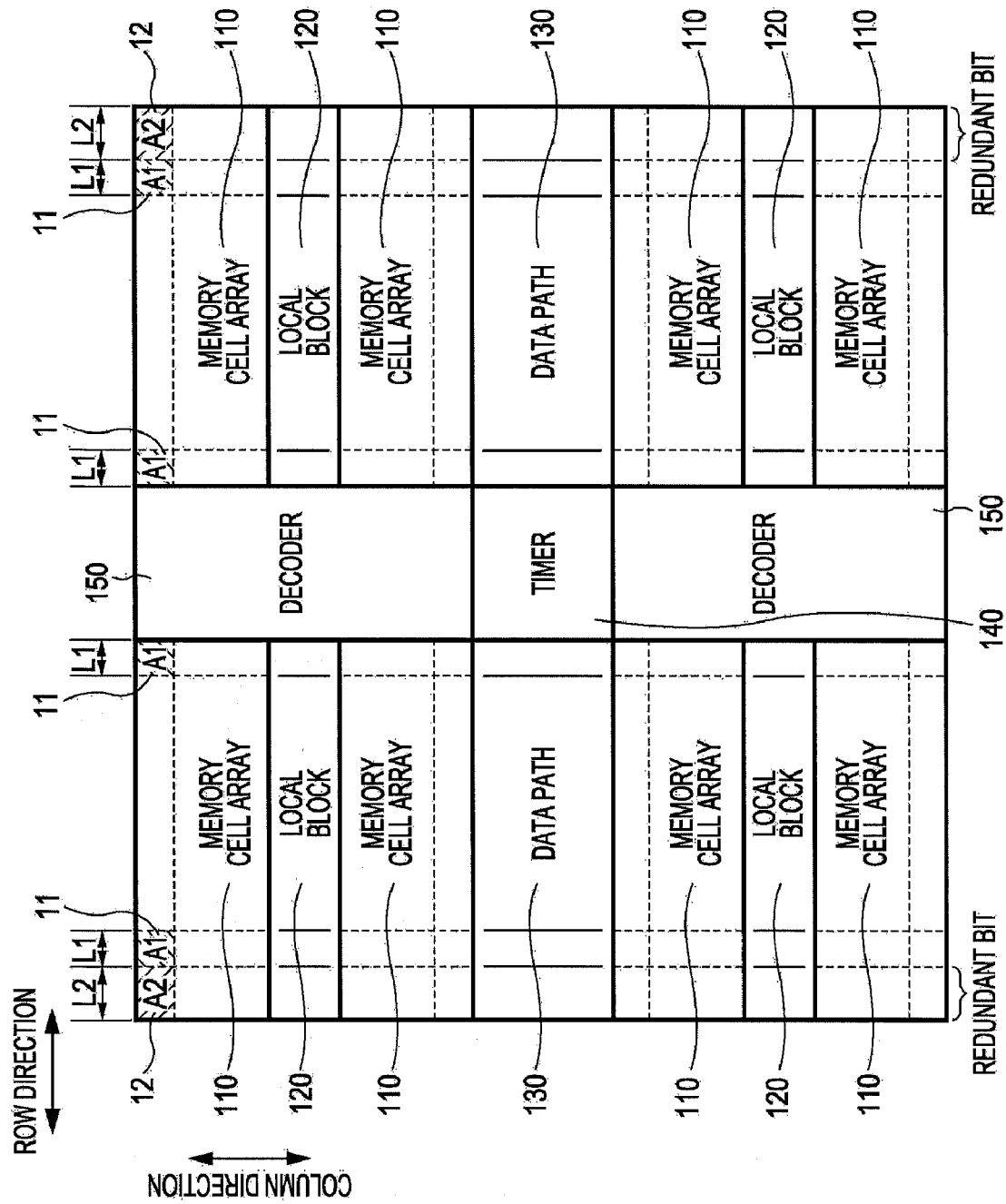
FIG. 2 is a schematic layout diagram of a semiconductor memory according to an embodiment.

FIG. 2 illustrates a schematic plan view of an SRAM macro functioning as a semiconductor memory according to a first embodiment.

The SRAM macro in FIG. 1 includes memory cell arrays 110, local blocks 120, data paths 130, a timer 140 and decoders 150. In each of the memory cell arrays 110, memory cells 11 are arranged two-dimensionally in the row and column directions. As illustrated in FIG. 2, the row direction of the memory cell arrays 110 is the horizontal direction in FIG. 2 while the column direction is the vertical direction in FIG. 2. Therefore, in the memory cell arrays 110, a series of memory cells 11 aligned in the horizontal direction are memory cells 11 in a row while a series of memory cells 11 aligned in the vertical direction is memory cells 11 in a column. For convenience of illustration, FIG. 2 only illustrates a part of the memory cells 11 and 12 contained in the memory cell arrays 110, and the other memory cells 11 and 12 are not illustrated. The lengths in the row direction of the memory cells 11 are uniformly L1. Moreover, the lengths in the row direction of the redundant memory cells 12, which may be described later, are uniformly L2 that is longer than L1. The lengths in the column direction of each of the memory cells 11 and 12 are uniform. The areas of the memory cells 11 are uniformly A1. Moreover, the areas of the redundant memory cells 12 are uniformly A2 that is larger than A1. The size comparison relationship of A1 and A2 results in that A2>A1 because L2>L1.

The timer 140 performs operation control over the entire SRAM macro. The timer 140 receives control signals and address signals from external circuits. The timer 140 may switch between the ON and OFF states of the SRAM macro in accordance with a control signal and address signal. Moreover, the timer 140 may adjust the operating timing or designate a memory cell 11 or 12 from or to which data is to be read or written, for example. The decoders 150 transmit a write enable signal to the corresponding local block 120 and memory cell array 110 in accordance with a control signal from the timer 140. The write enable signal enables reading data from designated memory cells 11 or 12 or writing data to designated memory cells 11 or 12. The data paths 130 control external input/output to/from the SRAM macro on data read from memory cells 11 or 12 and data to be written to the memory cells 11 or 12. In reading data from the memory cell 11 or 12, the corresponding local block 120 controls so as to determine a signal acquired from the memory cell array 110 from the sense amplifier 21 or 22. Then, the corresponding local block 120 transmits the signal to the corresponding data path 130. In writing data to a memory cell 11 or 12, the corresponding local block 120 controls so as to transmit the data received from the data path 130 to the corresponding memory cell array 110. Then, the corresponding local block 120 controls so as to write the data to the corresponding memory cell 11 or 12. In the memory cell arrays 110, data are written to the memory cells 11 or 12 being the target of the data writing, or read from the memory cells 11 or 12 being the target of the data reading on the basis of the signals received from the decoder 150 and local block 120. In other words, an address signal designating the memory cell 11 or 12 being the target of the data reading or writing is transferred from the timer 140 to the decoder 150. Then, the decoder 150 decodes the address signal. As a result, the memory cell 11 or 12 becomes accessible.

Figure 4:
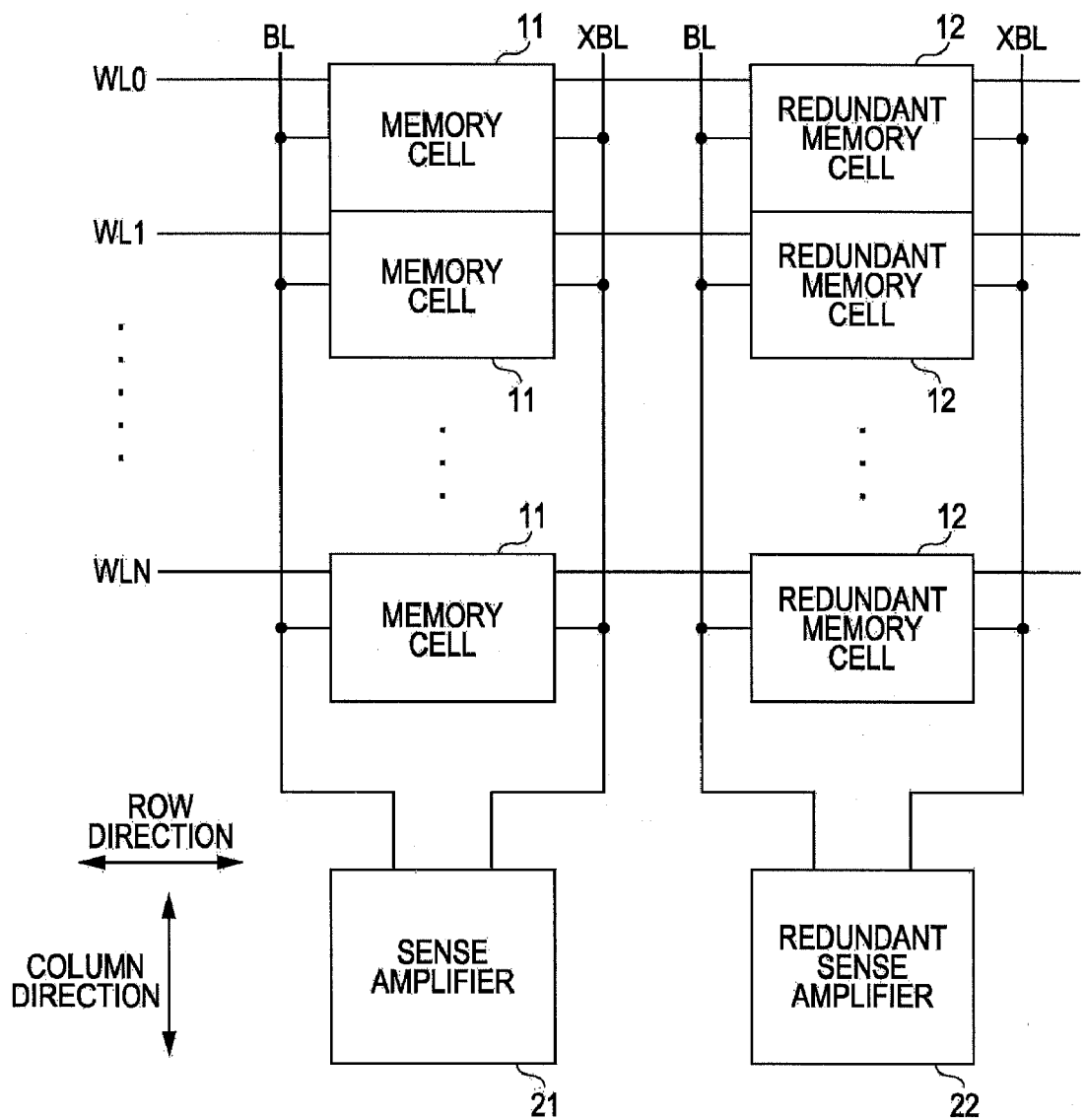
FIG. 4 is a circuit diagram of the part including memory cells and sense amplifiers in a semiconductor memory according to an embodiment.

In the SRAM macro according to the first embodiment in FIG. 2, the redundant memory cells 12 are provided in the column direction in the columns at the right and left ends of the memory cell arrays 110. In other words, referring to FIG. 2, the memory cells 12 in a total of two columns uniformly having a length of L2 in the row direction of the memory cell arrays 110 are uniformly assigned as redundant memory cells 12 in the memory cell arrays 110. As illustrated in FIG. 4, which may be described later, a redundant sense amplifier 22 and the redundant memory cells 12 in the same column share bit lines BL and XBL in each of the memory cell arrays 110.

In order to improve the operating characteristics of the SRAM macro when a redundant memory cell 12 is actually used instead of a defective memory cell 11, the transistors contained in the redundant memory cells 12 have a larger size than the transistors contained in the normal memory cells 11, as described later. Similarly, the number of transistors contained in each of the redundant sense amplifiers 22 is larger than the number of transistors contained in each of the normal sense amplifiers 21. More specifically, as described later with reference to FIG. 5, in each of the redundant memory cells 12, the contained transistors have the same length in the column direction as the length of the normal memory cells 11. Moreover, the contained transistors have the longer length only in the row direction. In each of the redundant sense amplifiers 22, the contained transistors have the same length in the column direction as the length of the normal sense amplifiers 21. Moreover, more transistors are aligned in the row direction. Thus, both of the redundant memory cells 12 and redundant sense amplifiers 22 may be longer only in the row direction. This may reduce the influence on the layout in the SRAM macro, in comparison with the case where the redundant memory cells 12 and redundant sense amplifier 22 are longer in both of the row direction and column direction.

According to this embodiment, the redundant memory cells 12 are arranged in the column direction of the memory cell array 110 as described above. The arrangement of the memory cells 12 may eliminate the necessity for word lines for the redundant memory cells 12, and the necessity for increasing the drive capability of the word lines may hardly be considered.

The sizes of the redundant memory cells 12 and redundant sense amplifiers 22 may be increased uniformly in the column direction. Thus, the size of the transistors in the redundant memory cells 12 and redundant sense amplifier 22 may be increased at the same time.

The circuit in the SRAM macro is configured such that a redundant memory cell is to be used instead of an actually defective memory cell 11, as described later FIGS. 18 to 22.

Like another embodiment as described later with reference to FIG. 3, the size of the transistors may be increased in the memory cells and sense amplifiers at positions where the required operating characteristics are not acquired in the SRAM macro. As a result, the entire SRAM macro may provide a uniform operating characteristic. The positions where the required operating characteristics are not acquired in the SRAM macro may refer to the farthest column from or the nearest column to the decoders 150 and the timer 140 at the center of the SRAM macros according to another embodiment in FIG. 3, for example. The reasons are as follows: The required operating characteristics such as operating timing and margins of the transistors contained in the memory cells 11 and sense amplifiers 21 in far and significantly close areas from the center of the SRAM macros are largely different from those of the transistors in the other area than the area. According to a second embodiment in FIG. 3, the difference is addressed by changing the size of the transistors in the memory cells 11 and sense amplifiers 21.

Figure 3:
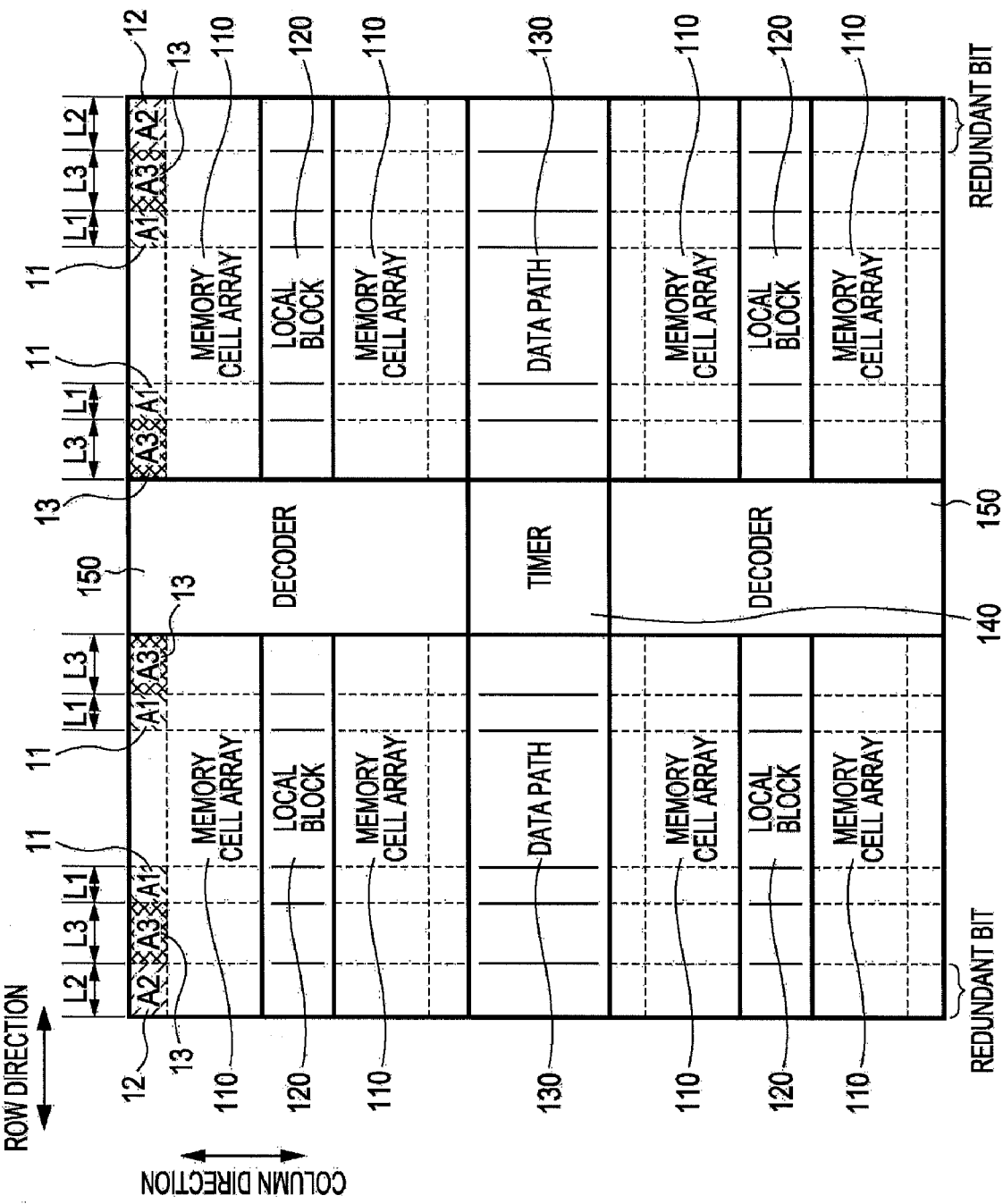
FIG. 3 is a schematic layout diagram of a semiconductor memory according to another embodiment.

According to the second embodiment in FIG. 3, as described above, the size of transistors even in the memory cells 11 and sense amplifier 21 at positions where the required operating characteristics are not acquired in the SRAM macro are increased like those in the redundant memory cells 12 and redundant sense amplifiers 22. In FIG. 3, like numbers refer to like components to those in FIG. 2, and the repetitive description may be omitted. The second embodiment in FIG. 3 is different form the first embodiment in FIG. 2 as follows. According to the second embodiment in FIG. 3, in the memory cell arrays 110 in the SRAM macro, the lengths in the row direction of the memory cells 13 in the neighboring columns to the decoders 150 and the timer 140 at the center and the sense amplifiers (not illustrated) in the column are uniformly L3. The length L3 is longer than the length L1 in the row directions of the normal memory cells 11. According to the second embodiment in FIG. 3, the lengths in the row direction of the memory cells 13 in the farthest columns from the decoders 150 and the timer 140 at the center and the sense amplifiers (not illustrated) in the columns are uniformly L3 in the memory cell arrays 110 in the SRAM macro. The expression "the farthest columns from the decoders 150 and the timer 140 at the center of the SRAM macro" refers to the columns that are one-column closer to the center than the column of the redundant memory cells 12, as illustrated in FIG. 3. The length in the column direction of the memory cells 13 is equal to the length of the normal memory cells 11. The area of each of the memory cells 13 is A3. Moreover, the area of each of the memory cells 13 is larger than the area A1 of each of the normal memory cells 11. The size comparison relationship of A1 and A3 results in that A3>A1 because L3>L1. Each of the memory cells 13 in the neighboring column to the decoders 150 and the timer 140 at the center may sometimes be called an end memory cell 13. Moreover, each of the memory cells 13 in the farthest columns from the decoders 150 and the timer 140 at the center of the SRAM macro may sometimes be called as "end memory cell". Similarly, each of the sense amplifiers (not illustrated) in the same columns as those of the end memory cells 13 may sometimes be called as "end amplifier".

As described above, according to the first embodiment in FIG. 2 and the second embodiment in FIG. 3, the size of transistors in partial memory cell arrays 110 and local blocks 120 contained in an SRAM macro are increased. Moreover, the number of transistors therein is increased. According to the first embodiment in FIG. 2, the sizes of transistors in the redundant memory cells 12 are uniformly larger than those of the normal memory cells 11 in each of the memory cell arrays 110. The number of parallel transistors in the redundant sense amplifiers 22 is larger than the number of parallel transistors in the normal sense amplifiers. According to the second embodiment in FIG. 3, the sizes of transistors in the redundant memory cells 12 and the end memory cells 13 are uniformly larger than the size of transistors in the normal memory cells 11. The number of parallel transistors in the redundant sense amplifiers 22 and the end amplifiers is higher than the number of parallel transistors in the normal sense amplifiers. As a result, the influence on the layout within the SRAM macro may be suppressed. Moreover, the stability and the sensitivity of the operations in the entire SRAM macro may be increased. In other words, the increased size of transistors may reduce the scatterings in performance between the transistors, as described later with reference to FIG. 12. The increased size of transistors may improve the stability of the operations in the entire SRAM macro as a result. The performance of memory cells increases as the size of transistors increases. The sensitivity increases as the number of parallel transistors in sense amplifiers increases. Thus, when the redundant memory cell 12 and redundant sense amplifier 22 are used instead of a defective memory cell 11 and the corresponding sense amplifier 21, the sensitivity of the entire SRAM macro may improve. According to the second embodiment in FIG. 3, uniform operating characteristics may be expected in the SRAM macro. In other word, according to the second embodiment in FIG. 3, the size of transistors in the memory cells having different required operating characteristics is increased so as to address the difference in required operating characteristics as described above. Furthermore, uniform operating characteristics may be expected within the SRAM macro. The increased size of the transistors may minimize the scatterings in characteristic values in manufacturing. Thus, the yield of the applied products may be improved, as described later in FIG. 12.

FIG. 4 illustrates the connection of signal lines in the vicinity of the redundant memory cells 12 and the redundant sense amplifiers 22 in memory cell arrays 110 in an SRAM macro of the first embodiment in FIG. 2. As illustrated in FIG. 4, the redundant memory cells 12 arranged in the column direction share bit lines BL and XBL, like the normal memory cells in the column direction in the other columns. Each row of the memory cell arrays 110 contains normal memory cells 11 and a redundant memory cell 12. The normal memory cell 11 and the redundant memory cell 12 in each row shares word lines WL0, WL2 . . . and WLN (also collectively called as word lines "WL").

According to the second embodiment in FIG. 3, as described above, the end memory cells 13 are arranged in the column direction in certain columns in the memory cell arrays 110. The end memory cells 13 also share the bit lines BL and XBL. According to the second embodiment, the each row in the memory cell arrays 110 contains normal memory cells 11, redundant memory cells 12 and end memory cells 13. The normal memory cells 11, redundant memory cells 12 and end memory cells 13 share the word lines WL in the rows.

Figure 5:
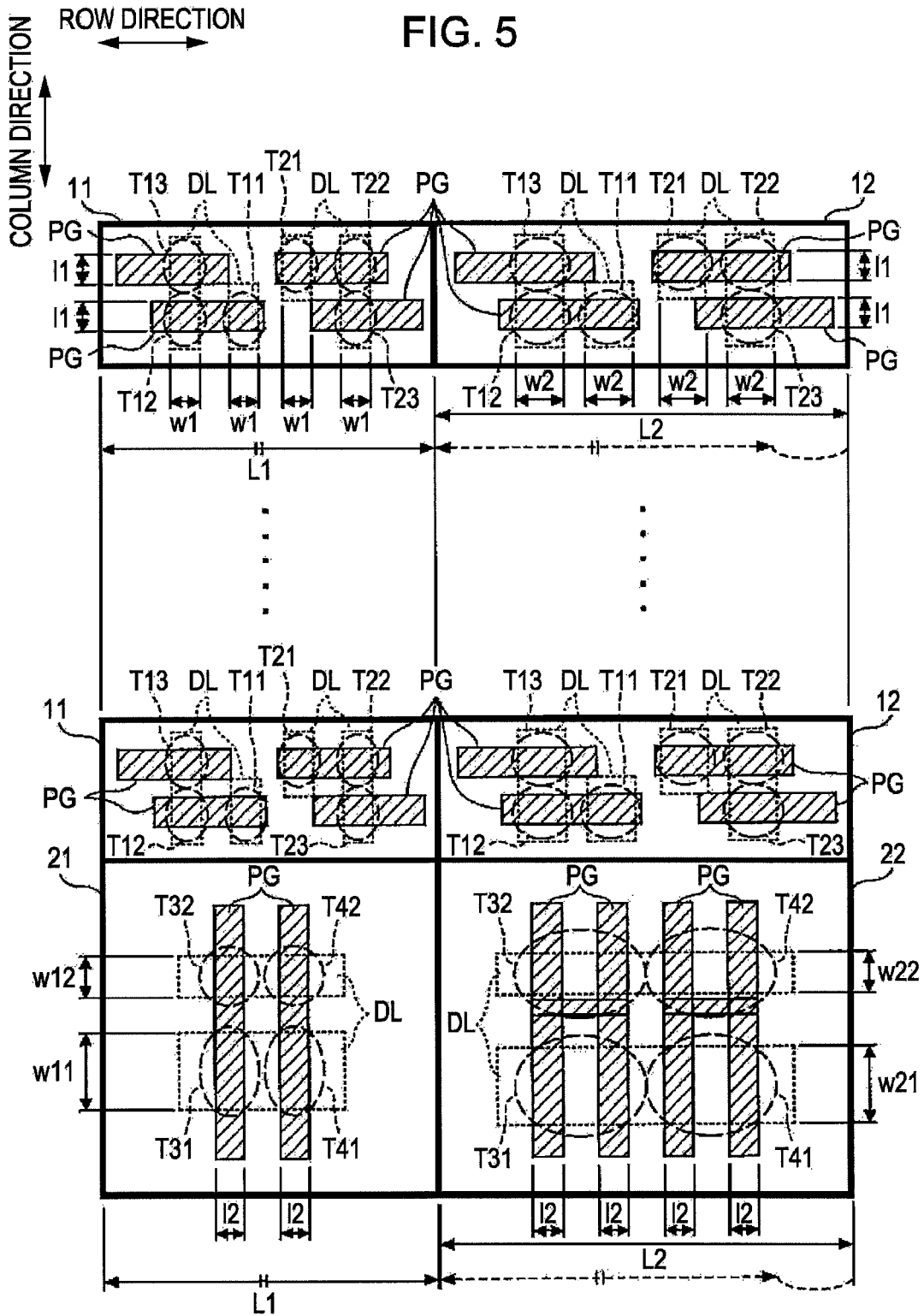
FIG. 5 is a schematic layout diagram of memory cell arrays and sense amplifiers in a semiconductor memory according to an embodiment.
Figure 6:
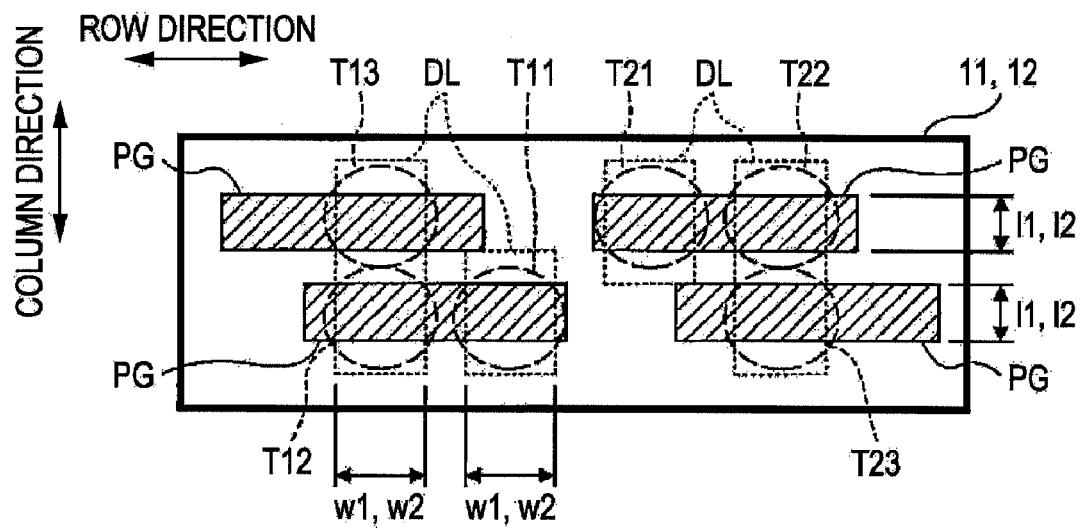
FIG. 6 is a schematic layout diagram of a memory cell in a semiconductor memory according to an embodiment.
Figure 7:
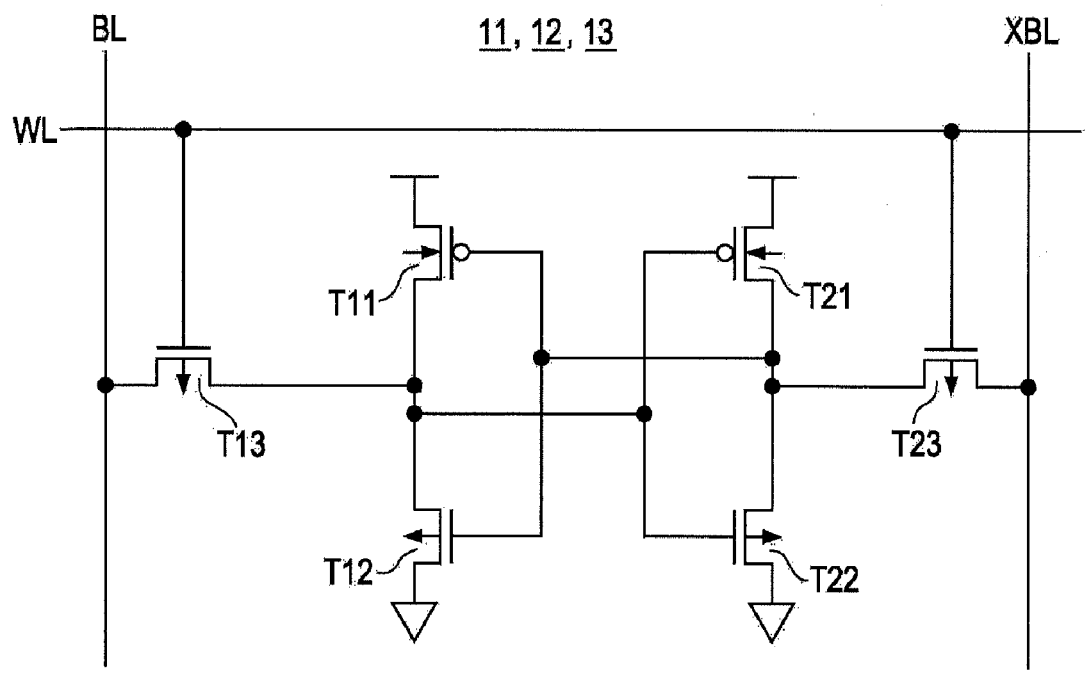
FIG. 7 is a circuit diagram of memory cells in a semiconductor memory according to an embodiment.

FIG. 5 illustrates the layout in the column having the redundant memory cells 12 and the vicinity in a memory cell array 110. FIG. 6 illustrates a simplified layout of each of the memory cells 11 and 12. The end memory cells 13 in the second embodiment in FIG. 3 have the same layout with FIGS. 5 and 6. FIG. 7 illustrates a circuit configuration of each of the memory cells 11 and 12. The end memory cells 13 in the second embodiment in FIG. 3 also have the same circuit configuration with FIGS. 5 and 6.

Figure 8:
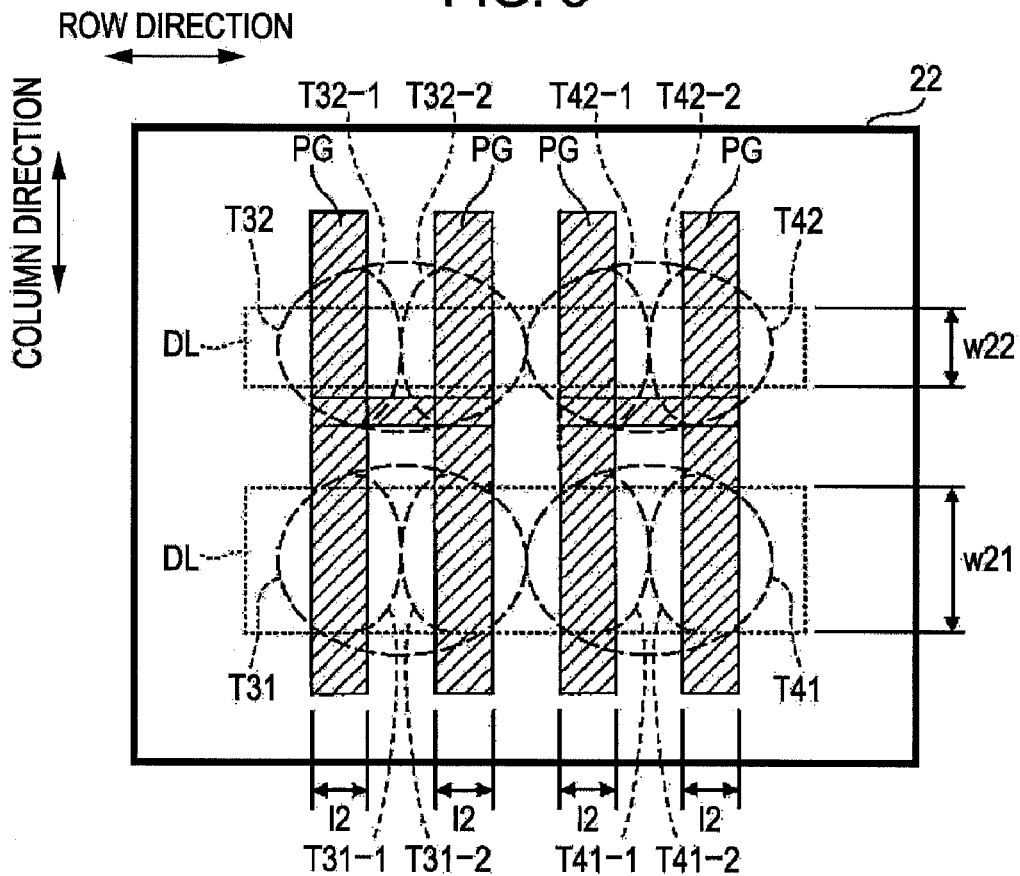
FIG. 8 is a schematic layout diagram of a redundant sense amplifier in a semiconductor memory according to an embodiment.
Figure 9:
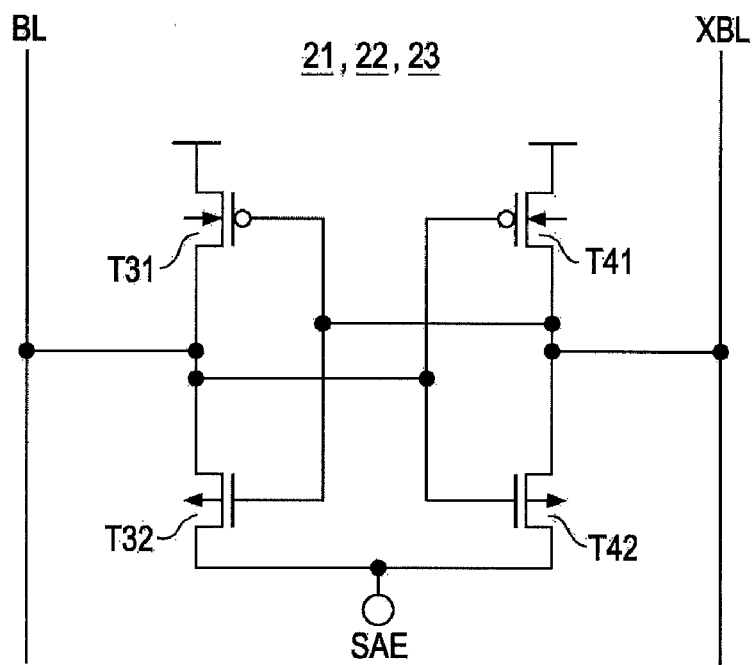
FIG. 9 is a circuit diagram of a sense amplifier in a semiconductor memory according to the second embodiment.

FIG. 8 illustrates a simplified layout of a redundant sense amplifier 22. The end amplifiers in the second embodiment in FIG. 3 have the same layout with FIG. 8. FIG. 9 illustrates a circuit configuration of each of normal sense amplifiers 21, redundant sense amplifiers 22 and illustrates another embodiment of the end amplifiers 23 illustrated in FIG. 3.

Figure 10B:
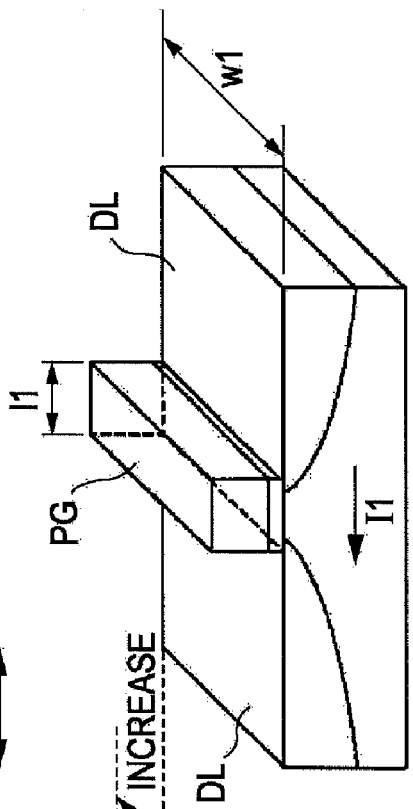
FIGS. 10A and 10B are perspective diagrams of a transistor included in a memory cell in a semiconductor memory according to an embodiment.
Figure 10A:
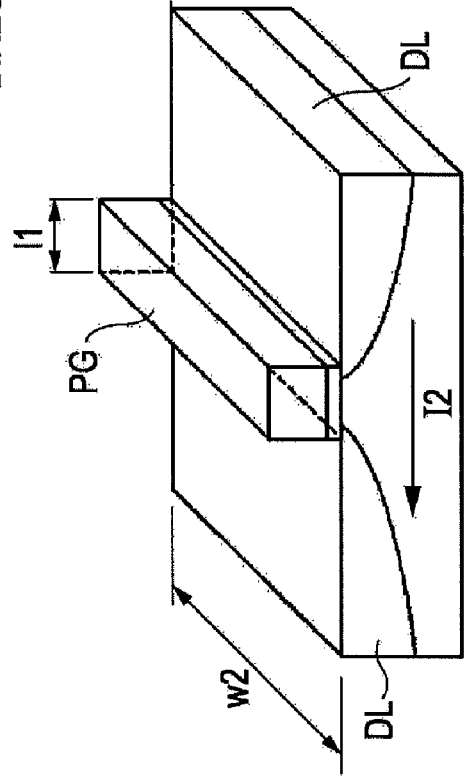

FIG. 10A is a schematic diagram of each of transistors T11 to T13 and T21 to T23 contained in a redundant memory cell 12. The transistors contained in each of the end memory cells 13 in the second embodiment in FIG. 3 have the same configuration. FIG. 10B is a schematic diagram of each of transistors T11 to T13 and T21 to T23 contained in a normal memory cell 11.

Figure 11B:
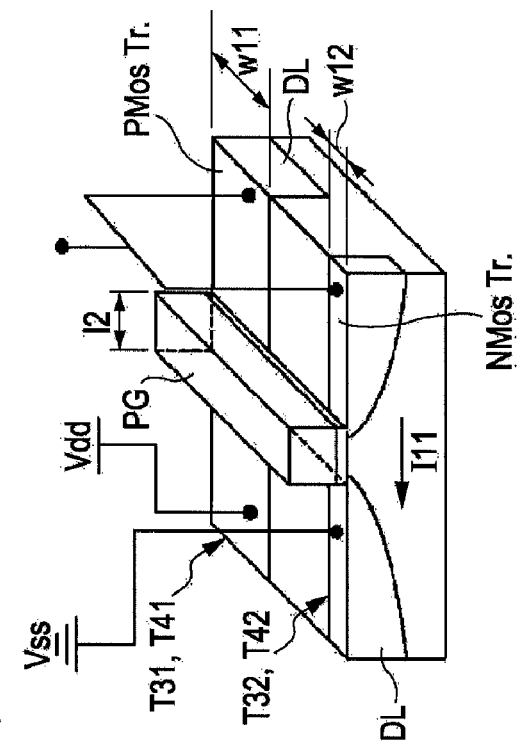
FIGS. 11A and 11B are perspective diagrams of a transistor included in a sense amplifier in a semiconductor memory according to an embodiment.
Figure 11A:
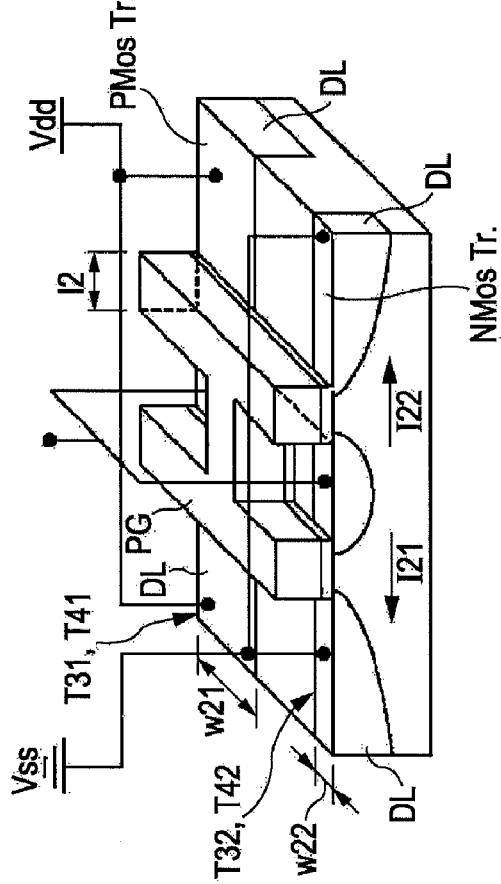

FIG. 11A is a schematic diagram of each of transistors T31, T41, T32, and T42 contained in a redundant sense amplifier 22. The transistors contained in each of the end amplifiers in the second embodiment in FIG. 3 have the same configuration. FIG. 11B is a schematic diagram of each of transistors T31, T41, T32, and T42 contained in a normal sense amplifier 21.

As illustrated in FIGS. 5, 6, 7, and 10A and 10B, each of the memory cells 11 and 12 contains six transistors T11 to T13 and T21 to T23. The same is true in each of the end memory cells 13 in the second embodiment in FIG. 3. The transistors T11 and T21 are P-channel metal oxide semiconductor field effect transistors (MOSFETs), and the transistors T12, T22, T13, and T23 are N-channel MOSFETs.

Figure 13A:
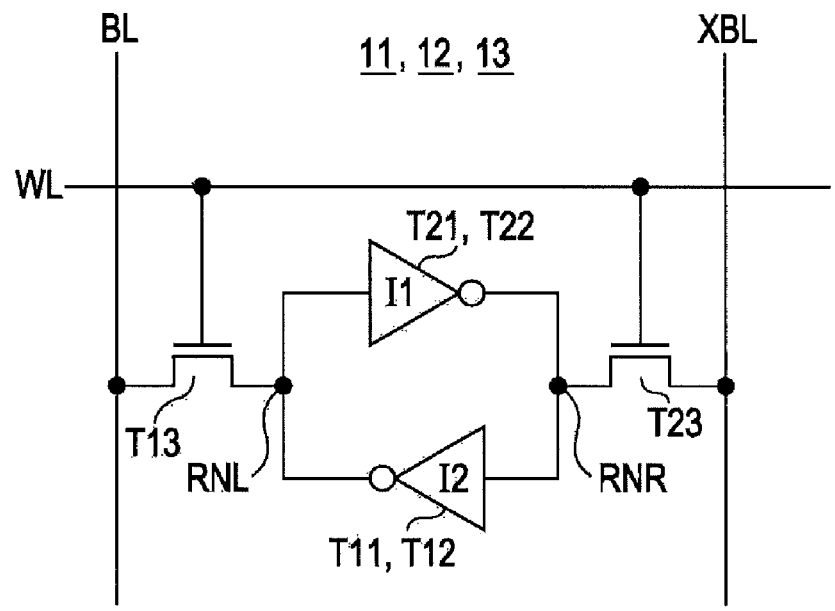
FIGS. 13A and 13B are circuit diagrams focusing on functions of a memory cell and sense amplifier in a semiconductor memory according to an embodiment.

A pair of the transistors T11 and T12 function as an inverter 12, as illustrated in FIG. 13A, which will be described later. Similarly, a pair of the transistors T21 and T22 functions as an inverter IL The transistors T13 and T23 are turned on by a signal of the word line WL and allow the signal to pass through between the corresponding memory cell 11 or 12 and the bit line BL and XBL.

Each of the transistors T11 to T13 and T21 to T23 has a gate electrode PG of polysilicon, a drain electrode and source electrode containing a diffusion layer DL. The gate lengths of the gate electrodes PG in the six transistors T11 to T13 and T21 to T23 in the memory cells 11 and 12 are uniformly 11. The same is true in the end memory cells 13 in the second embodiment in FIG. 3. The gate widths of the gate electrodes PG in the six transistors T11 to T13 and T21 to T23 in the normal memory cells 11 are uniformly w1. On the other hand, the gate widths of the gate electrodes PG in the six transistors T11 to T13 and T21 to T23 in the redundant memory cells 12 are uniformly w2. Here, the size comparison relationship of w1 and w2 is w2>w1. The same is true in the end memory cells 13 in the second embodiment in FIG. 3.

In other words, the redundant memory cells 12 and the end memory cells 13 in the second embodiment in FIG. 3 have transistors T11 to T13 and T21 to T23 having a larger gate width than the gate width of the normal memory cells 11. As a result, the redundant memory cells 12 and end memory cells 13 extends in the row direction, in comparison with the normal memory cells 11. The increase in length in the row direction is determined quantitatively to be consistent with the increase in area of the local block 120. The increase in area of the local block 120 is caused by the increase in gate width of each of the transistors T31, T32, T41, and T42 in the redundant sense amplifiers 22 and the end amplifiers in the second embodiment in FIG. 3.

The increase in gate width of the redundant memory cells 12 as described above in comparison with the gate width of the normal memory cells 11 allows larger current I2 flowing than the current I1 in the normal memory cells 11 when the transistors T11 to T13 and T21 to T23 are turned on as illustrated in FIG. 10.

Next, as illustrated in FIGS. 5, 8, 9, and 11A and 11B, each of the sense amplifiers 21 and 22 contains four transistors T31, T32, T41, and T42. The same is true in the end amplifiers in the second embodiment in FIG. 3. The transistors T31 and T41 are P-channel MOSFETs, and the transistors T32 and T42 are N-channel MOSFETs.

Figure 13B:
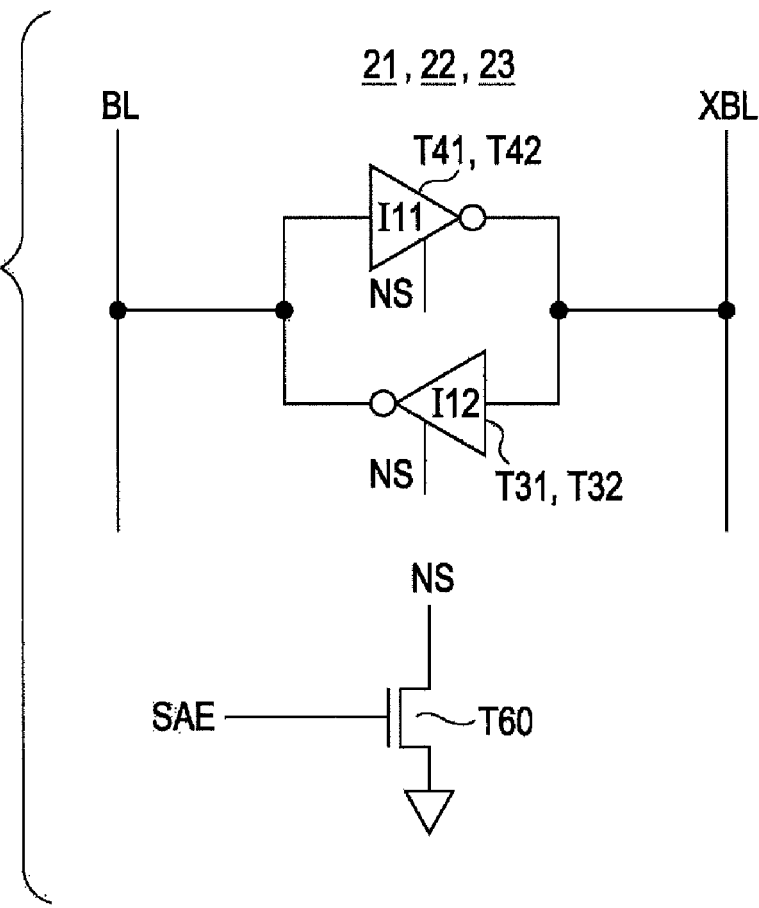

Each of the transistors T31 and T32 functions as an inverter 112, as illustrated in FIG. 13B, which may be described later. Similarly, each of the transistors T41 and T42 functions as an inverter I11. Each of the sense amplifiers 21 and 22 has a latch configuration in which the two inverters I11 and I12 are connected in a loop form.

Each of the transistors T31, T32, T41 and T42 has a gate electrode PG of polysilicon, and a drain and source containing a diffusion layer DL. The gate lengths of the gate electrodes PG of the four transistors T31, T32, T41, and T42 contained in the sense amplifiers 21 and 22 are uniformly 12. The same is true in the end amplifiers in the second embodiment in FIG. 3.

In the four transistors T31, T41, T32, and T42 contained in the normal sense amplifier 21, the gate widths of the gate electrodes PG of the N-channel MOSFETs T32 and T42 are uniformly w11. The gate widths of the gate electrodes PG of the P-channel MOSFETs T31 and T41 are uniformly w12. In this case, since the P-channel MOSFETs have a worse current characteristic, the gate widths are adjusted to obtain w11>w12 for consistency of the current characteristic with the N-channel MOSFETs.

In the four transistors T31, T41, T32, and T42 contained in a redundant sense amplifier 22, the gate widths of the gate electrodes PG of the N-channel MOSFETs T32 and T42 are uniformly w21. The gate widths of the gate electrodes PG of the P-channel MOSFETs T31 and T41 are uniformly w22. For the same reason, w21>w22. The gate width w12=the gate width w22, and the gate width w11=the gate width w21. However, in a redundant sense amplifier 22, as illustrated in FIG. 8, the four transistors T31, T41, T32, and T42 include two transistors T31-1 and T32-2, T41-1 and T41-2, T32-1 and T32-2, and T42-1 and T42-2, which are connected in parallel.

As a result, in FIG. 11A, when the far P-channel MOSFET T31 or T41 is turned on, currents (not illustrated) flow in parallel from the source electrodes of the far right and left parallel-connected two transistors in FIG. 11A to the drain electrodes at the center. Similarly, the near N-channel MOSFET T32 or T42 is turned on ON, the currents I21 and I22 flow in parallel from the drain electrodes of the parallel-connected two transistors at the near center in FIG. 11A to both right and left sources. In the normal sense amplifier 21 in FIG. 11B, when the far P-channel MOSFET T31 or T41 is turned on, current (not illustrated) flows from the far left source to the right drain in FIG. 11B. Similarly, when the near N-channel MOSFET T32 or T42 is turned on, the current I11 flows from the near right drain electrode to the left source in FIG. 11B.

In a redundant sense amplifier 22, as described above, the transistors T31, T41, T32, and T42 have the two transistors T31-1 and T32-2, T41-1 and T41-2, T32-1 and T32-2, and T42-1 and T42-2, which are connected to each other in parallel. This doubles the current between the source electrodes and the drain electrodes of the parallel connected transistors when the transistors T31, T41, T32, and T42 are turned on, compared with the normal sense amplifier 21. As a result, the equivalent effect may be acquired to the double gate widths of the transistors T31, T41, T32, and T42. In the redundant sense amplifier 22, as described above, the transistors T31, T41, T32, and T42 respectively have the two transistors T31-1 and T32-2, T41-1 and T41-2, T32-1 and T32-2, and T42-1 and T42-2, which are connected to each other in parallel. In this case, the two transistors which are connected to each other in parallel are arranged in the row direction, as illustrated in FIG. 8. As a result, the length L2 in the row direction of the redundant sense amplifier 22 is longer than the length L1 in the row direction of the normal sense amplifier 21 as illustrated in FIG. 5. Similarly, according to the second embodiment in FIG. 3, the length L3 in the row direction of the end amplifier 23 is longer than the length L1 in the row direction of the normal sense amplifier 21.

As descried above, the transistors in the redundant memory cells 12 and redundant sense amplifiers 22 have a larger gate width than the transistors in the normal memory cells 11 and normal sense amplifiers 21. The configuration of the transistors in the redundant memory cells 12 and redundant sense amplifiers 22 provides the equivalent effect to those having the longer gate widths. The same is also true in the end memory cells 13 and end amplifiers 23 in the second embodiment in FIG. 3. The increase in gate width of the transistors increases the value of current flowing in the transistors when the transistors are turned on. Thus, the performance and sensitivity of the redundant memory cells 12 and redundant sense amplifiers 22 may be improved. The same is also true in the end memory cells 13 and end amplifiers 23 in the second embodiment in FIG. 3.

Figure 12:
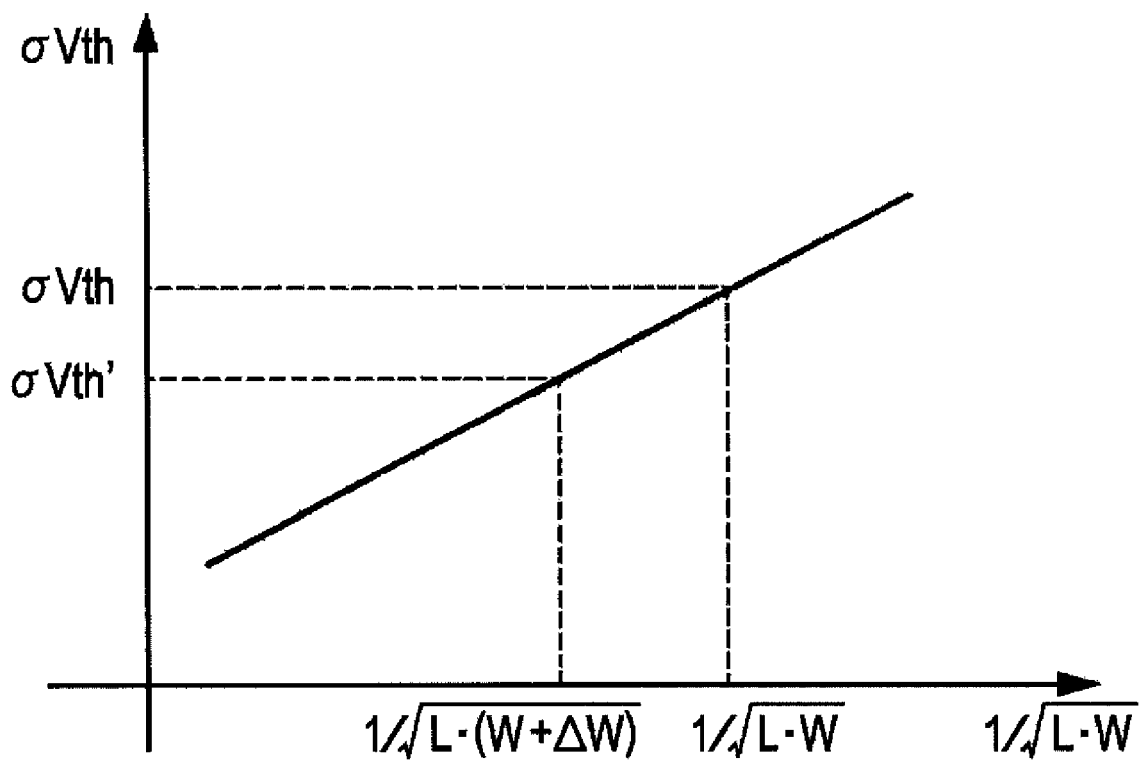
FIG. 12 illustrates a relationship between transistor areas and scatterings in transistor performance.

The characteristics of a transistor may strongly depend on a threshold voltage mainly. The threshold voltage varies between transistors due to scatterings in manufacturing. The scattering values strongly depend on the area (L*W) of the transistor. When the magnitude of a scattering value is σVth, the relationship may be as illustrated in FIG. 12, for example. The redundant memory cells 12 and redundant sense amplifiers 22 (and the end memory cells 13 and end amplifiers 23 in the second embodiment in FIG. 3) have a larger area than the normal memory cells 11 and normal sense amplifiers 21. Thus, the scattering values are relatively small. This may stabilize the characteristics of the redundant memory cells 12 and redundant sense amplifiers 22 (and the end memory cells 13 and end amplifiers 23 in the second embodiment in FIG. 3). Moreover, the improvement in yield of the SRAM macro may be expected.

Figure 14A:
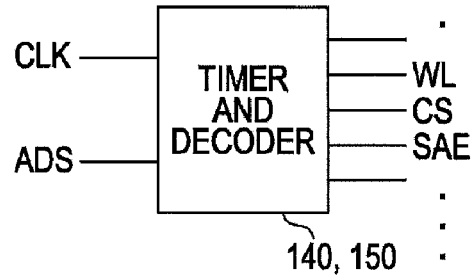
FIG. 14A is a block diagram of a timer and a decoder of a semiconductor memory according to an embodiment.
Figure 14B:
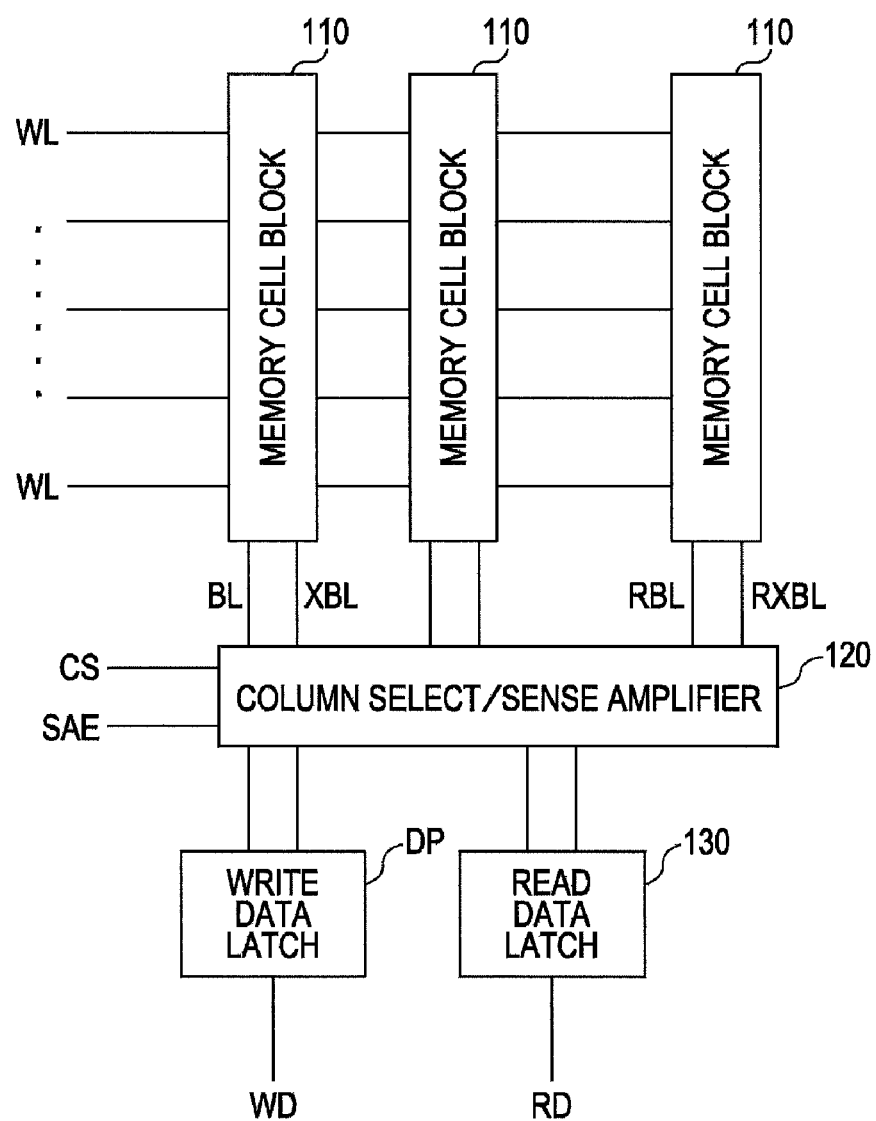
FIG. 14B is a partial block diagram of a semiconductor memory according to an embodiment.
Figure 15:
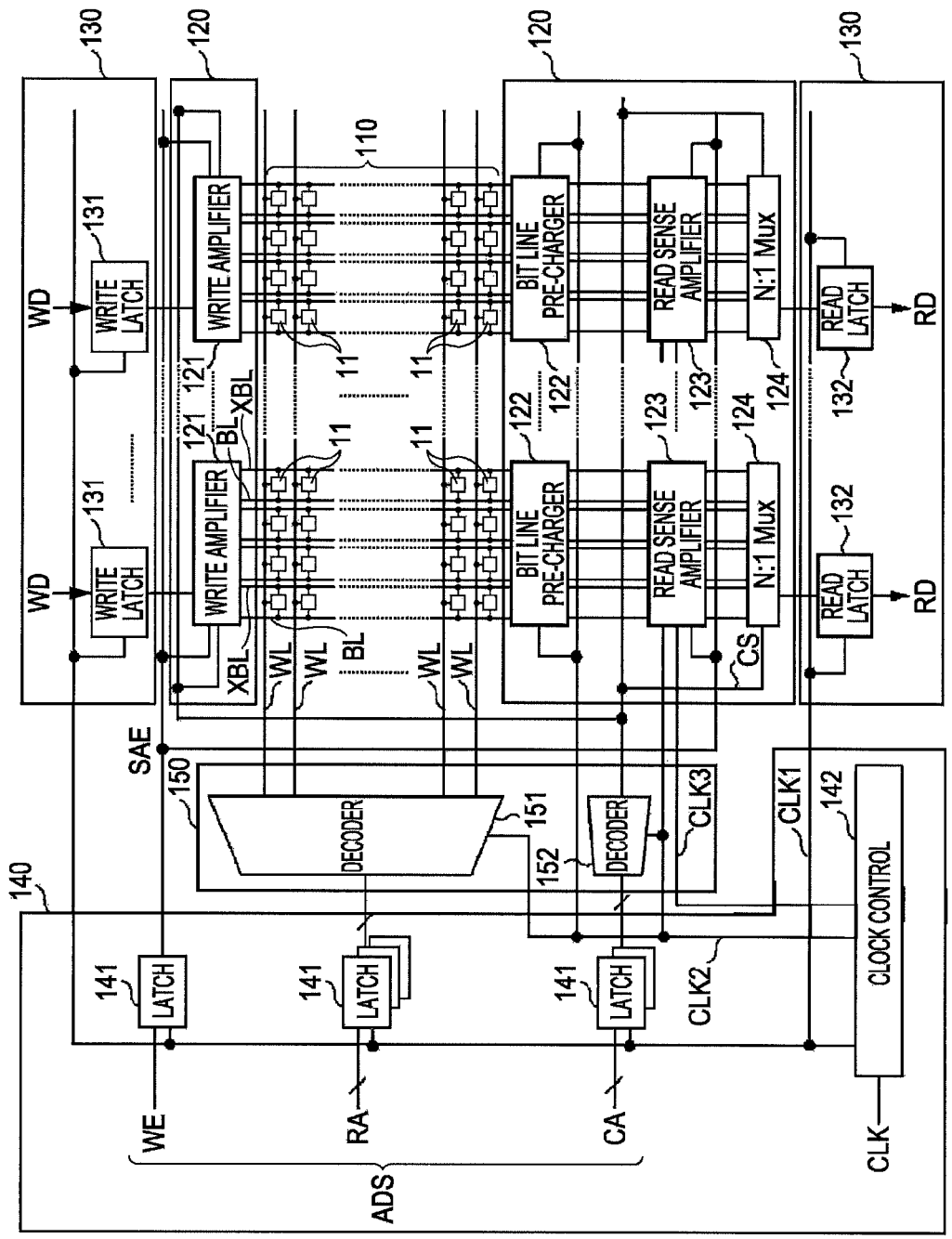
FIG. 15 is a whole block diagram of a semiconductor memory according to an embodiment.

FIG. 13A is a circuit diagram of a memory cell 11 or 12 (which is also true in the end memory cells 13 in the second embodiment in FIG. 3). FIG. 13B is a circuit diagram of a sense amplifier 21 or 22 (which is also true in the end amplifier 23). FIGS. 14A and 14B are circuit diagrams in the vicinity of the memory cell arrays 110. FIG. 15 is a circuit diagram of the entire SRAM macro. FIG. 16 is a timing chart in reading. FIG. 17 is a timing chart in writing.

As illustrated in FIG. 13A, the memory cell has a latch configuration in which the inverters I1 and I2 are connected in a loop form. The input/output terminals RNL and RNR of the latch are connected to the bit lines BL and XBL through the transistors T13 and T23 for selecting the memory cell.

As illustrated in FIG. 13B, the sense amplifier has a latch configuration in which the inverters I11 and I12 are connected in a loop form. A source electrode NS of the N-channel MOSFETs included in the inverters I11 and I12 are connected to a transistor T60 that receives a sense-amplifier enable signal SAE.

As illustrated in FIG. 14A, a timer 140 and decoders 150 receive a clock signal CLK, an address signal and a write enable signal (collectively called an ADS) from external circuits and outputs a signal of the word line WL, a column select signal CS and the sense-amplifier enable signal SAE.

As illustrated in FIG. 14B, the signal of the word line WL is given to a memory cell array 110, and a row of memory cells included in the memory cell array 110 is thus selected. The column select signal CS and sense-amplifier enable signal SAE are given to the local block 120, and a column of the memory cells contained in the memory cell array 110 is thus selected. The local block 120 and memory cell arrays 110 are connected via bit lines BL and XBL. For convenience of description, RBL and RXBL in FIG. 14B refer to the bit lines BL and XBL of the columns having redundant memory cells 12 and redundant sense amplifiers 22. As illustrated in FIG. 14B, write data WD to be output to a memory cell array 110 are given through a latch (write data latch) of a data path 130 to the local block 120. The read data RD retrieved from a memory cell array 110 is once received through the local block 120 by a latch (read data latch) of the data path 130. Then, the read data RD is then output to an external circuit.

As illustrated in FIG. 15, the timer 140 includes a latch 141 that receives a write enable signal WE, a row address signal RA and a column address signal CA (collectively called an ADS) from external circuits. The timer 140 further includes a clock control portion 142 that externally receives a clock signal CLK from an external circuit and generates internal clock signals CLK1, CLK2, and CLK3.

The decoder 150 includes a decoder 151 that decodes a row address signal RA to generate a word line signal WL. Moreover, the decoder 150 includes a decoder 152 that decodes a column address signal CA to generate a column select signal CS. The data path 130 includes the write data latch 131 that once latches write data WD. Moreover, the data path 130 includes the read data latch 132 that once latches read data RD.

As illustrated in FIG. 15, the local block 120 includes an amplifier 121 that amplifies write data WD and outputs the write data WD via the bit lines BL and XBL to a memory cell array 110. The local block 120 further includes a bit precharger 122 that pre-charges the corresponding bit lines included in a memory cell array 110. The local block 120 further includes a sense amplifier 123 (including the sense amplifiers 21 and 22) that amplifies and fixes read data RD. The local block 120 further includes a multiplexer 124 that selects read data RD in the column designated by the column select signal CS.

FIG. 15 separately illustrates the local blocks 120 and the data paths 130 above and below the memory cell array 110. FIG. 15 is separately illustrated for the purpose of easy understanding of the flow of signals of write data WD and read data RD and the circuit configuration. The real layout within the SRAM macro is as illustrated in FIG. 2 or 3.

FIG. 16A illustrates a waveform of the clock signal CLK. FIG. 16B illustrates waveforms of address signals RA and CA. FIG. 16C illustrates a waveform of a signal in the word line WL. FIG. 16D illustrates a waveform of the column select signal CS. FIGS. 16E and 16F illustrate waveforms of signals at internal nodes RNL and RNR in a memory cell, respectively. FIG. 16G illustrates a signal waveform of the sense-amplifier enable signal SAE. FIGS. 16H and 16I illustrate waveforms of signals of the bit lines BL and XBL, respectively. FIG. 16J illustrates a signal waveform of read data RD.

In order to read data, a row included in a memory cell array 110 is selected in accordance with the signal of the word line WL generated on the basis of a row address signal RA. A column included in the memory cell array 110 is selected in accordance with the column select signal CS generated on the basis of the column address signal CA. From memory cells in the row selected in accordance with the word line WL and the column selected in accordance with the bit lines BL and XBL, read data RD is retrieved through the sense amplifier 123 in the column. The read data RD is output through the multiplexer 124 and read data latch 132. Here, the sense amplifier 123 (21 or 22) latches the signal resulting from the amplification of the signal output from the memory cell 11 or 12 to the bit lines BL and XBL to fix the read data RD. In the example in FIGS. 16A to 16J, data with a low output signal RD are read, as illustrated in FIG. 16J. In this case, as illustrated in FIG. 16I, the bit line XBL becomes low. As illustrated in FIG. 16J, the read data RD becomes low. The broken waveform in FIG. 16I is an example of the waveform when the memory cell is a redundant memory cell 12. In the case with a redundant memory cell 12, the bit line XBL becomes low earlier than the case with the normal memory cell case (as indicated by the solid waveform GB) as illustrated in FIG. 16I. In other words, the redundant memory cells 12 and redundant sense amplifiers 22 allow faster reading operation than the normal memory cells 11 and sense amplifiers 21. This is because, as described above, the redundant memory cells 12 and redundant sense amplifiers 22 include larger transistors or more parallel transistors than the normal memory cells 11 and normal sense amplifiers 21 and may proportionally provide higher performance.

Figure 17G:
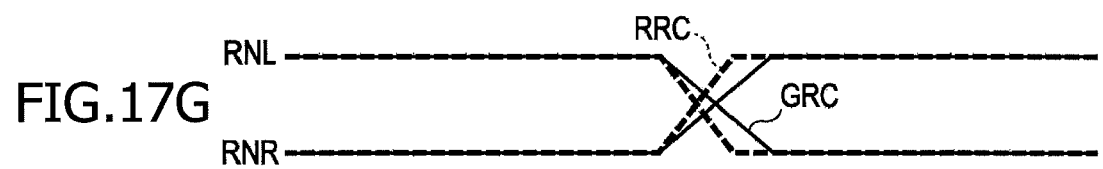

FIG. 17A illustrates a waveform of the clock signal CLK. FIG. 17B illustrates waveforms of the address signals RA and CA. FIG. 17C illustrates a waveform of write data WD. FIG. 17D illustrates a waveform of a signal in the word line WL. FIG. 17E illustrates a waveform of the column select signal CS. FIG. 17F illustrates waveforms of signals of the bit lines BL and XBL. FIG. 17G illustrates waveforms of signals at internal nodes RNL and RNR, respectively, in a memory cell.

In order to write data, a row included in a memory cell array 110 is selected in accordance with the signal of the word line WL generated on the basis of a row address signal RA. A column included in the memory cell array 110 is selected in accordance with the column select signal CS generated on the basis of the column address signal CA. To memory cells in the row selected in accordance with the word line WL and the column selected in accordance with the bit lines BL and XBL, write data WD are written through the write data latch 131 and amplifier 121. In the example in FIGS. 17A to 17G, as illustrated in FIG. 17F, the bit line XBL becomes low. Through the transistors T13 and T23, the signals at the internal node RNR becomes high level, and the signal at the internal node RNL becomes low level. Then, the write data WD is written. The broken waveform in FIG. 17G is an example of the waveforms when the memory cell is the redundant memory cell 12. In the case with a redundant memory cell 12, the change in state from low level to high level in the internal node RNR and the change in state from high level to low level in the internal node RNL are faster than the case with a normal memory cell (as indicated by the solid waveform GRC) as illustrated in FIG. 17G. In other words, the redundant memory cells 12 allow faster writing operations than the normal memory cells 11. This is because, the redundant memory cells 12 contain larger transistors than the normal memory cells 11 and may proportionally provide drive capability as described above.

Figure 18:
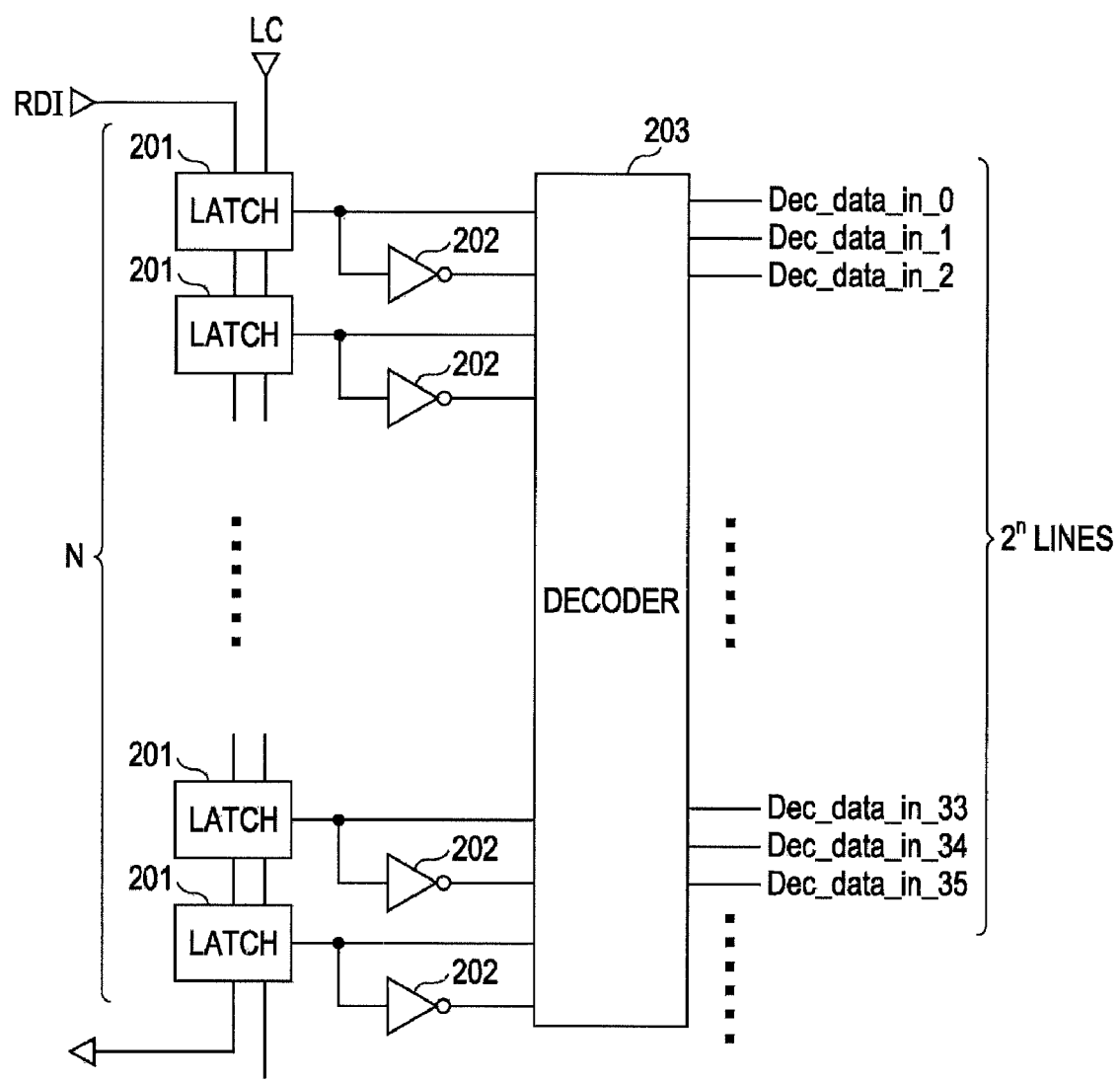
FIG. 18 is a block diagram of a circuit that inputs redundant data in a semiconductor memory according to an embodiment.
Figure 19:
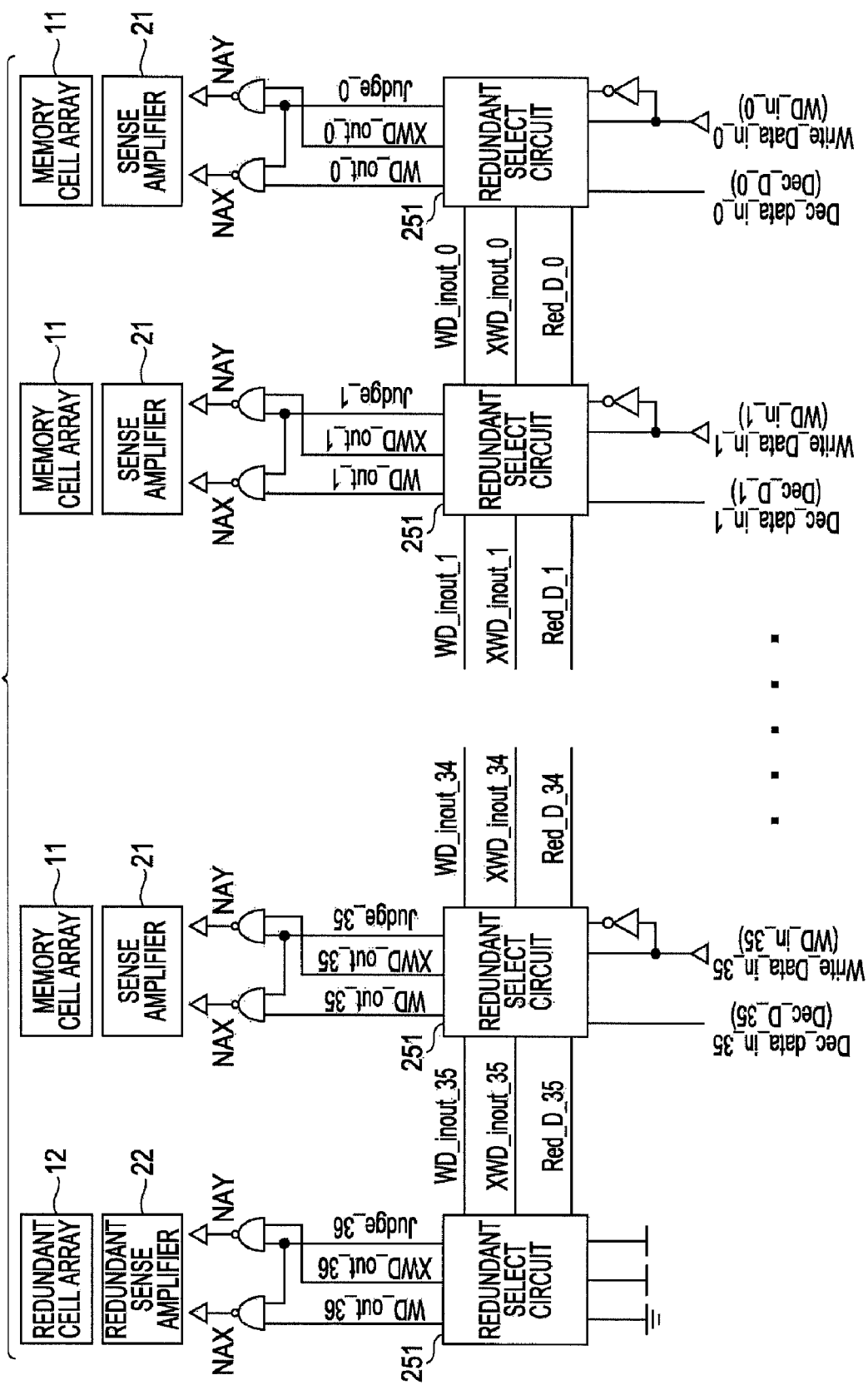
FIG. 19 is a circuit diagram illustrating redundant select circuits (in writing) and the vicinity in a semiconductor memory according to an embodiment.
Figure 20:
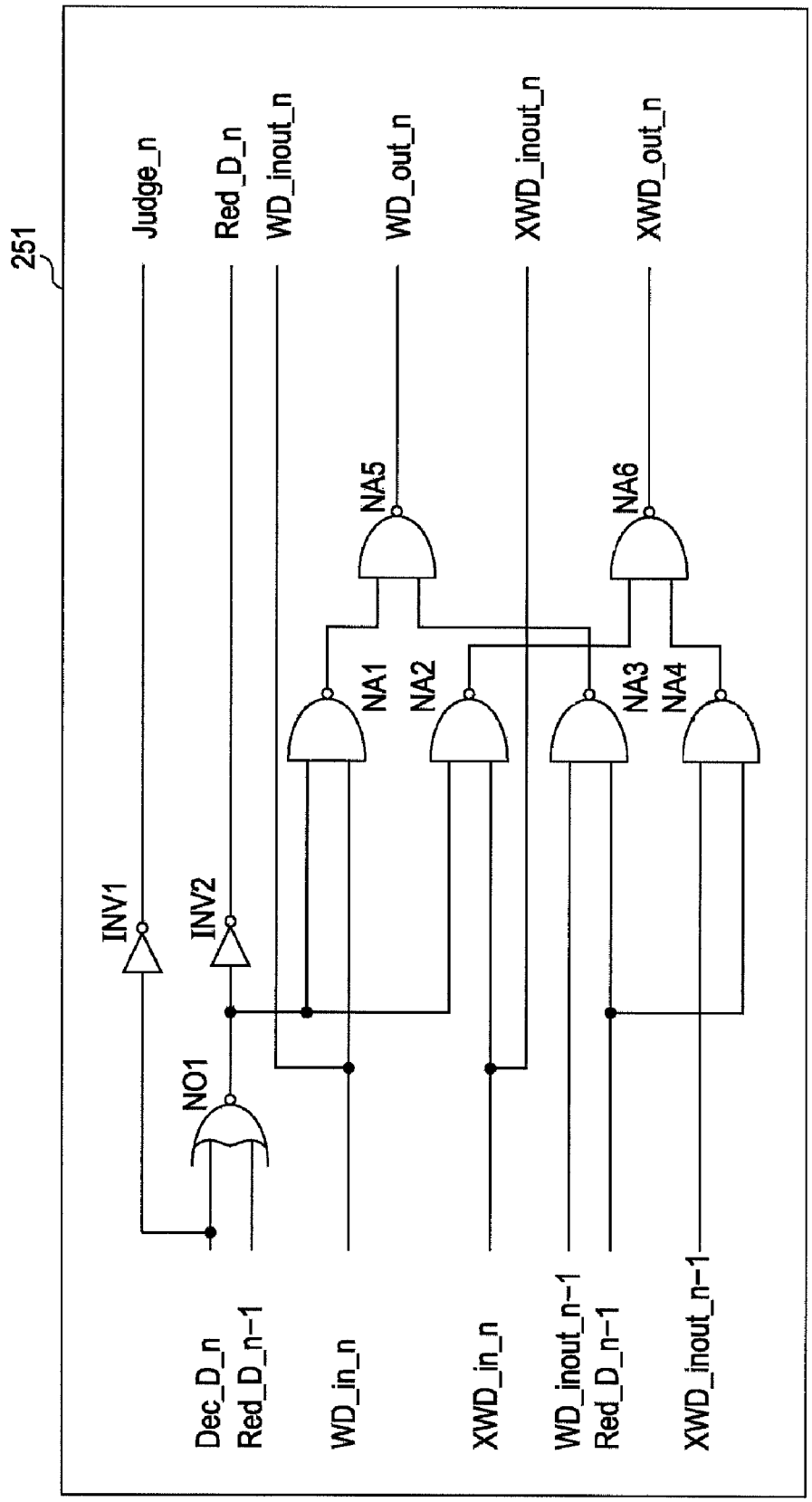
FIG. 20 is a circuit diagram illustrating redundant select circuits (in writing) and the vicinity in a semiconductor memory according to an embodiment.

Next, with reference to FIGS. 18 to 20, there may be described a redundant replacement applicable to both of the SRAM macros according to the first embodiment in FIG. 2 and the second embodiment in FIG. 3.

According to the redundant replacement, when a defective memory cell 11 or a defective sense amplifier 21 exists within an SRAM macro, it is replaced by a redundant memory cell 12 or redundant sense amplifier 22, respectively. As a result, the fraction defective of the SRAM macro may be reduced. As described above, the replacement of the failed (or defective) memory cell 11 or failed (or defective) sense amplifier 21 by a redundant memory cell 12 or redundant sense amplifier 22 may be simply called a "redundant replacement" hereinafter.

Redundant data RDI for use in implementing the redundant replacement are prestored in a storage (not illustrated) provided outside of an SRAM macro. An SRAM macro product requiring a redundant replacement reads and uses the stored redundant data RDI when the redundant data RDI is used.

FIG. 18 illustrates a circuit that reads and decodes redundant data RDI. The circuit is also provided in the data paths 130 within the SRAM macro. Here, the redundant data RDI itself is acquired in advance through tests on the SRAM macro products before shipment. The circuit includes N latches 201, N inverters 202, and a decoder 203. The redundant data RDI are read in advance from the storage where the redundant data RDI is prestored by a system operation when the SRAM macro product is powered on. The read redundant data RDI are sequentially stored in a series of the latches 201 on the basis of the pulses of serial latch clock signals LC. The redundant data RDI stored in the latches 201 in this way are permanently held in the latches 201 until the SRAM macro is powered off.

After stored in the latches 201 in this way, the N-bit redundant data RDI are input through the inverters 202 to the decoder 203. Then, the N-bit redundant data RDI are decoded in the decoder 203. As a result, two to the nth power redundant select signals Dec_data_in_xx are output from the decoder 203. In the output data, 1 bit indicating a defective memory cell only has "1", and the other bits all have "0". The "xx" in the redundant select signals Dec_data_in_xx indicates a value of 0, 1, 2, ..., 35, .... The "xx" is also called an "n".

FIG. 19 illustrates an example of a circuit that replaces a memory cell 11 and sense amplifier 21 for one bit of a failed (or defective) part by a redundant memory cell 12 and redundant sense amplifier 22 on the basis of the redundant select signal Dec_data_in_xx output from the decoder 203 in data writing. The circuit is also included in the data paths 130 of the SRAM macro. This example assumes that write data WD, Write_Data_in_xx, for 36 bits are input. In other words, each of the rows of the memory cell array 110 includes 37 memory cells 11 and 12 for a total of 37 bits including 36 normal memory cells 11 and one redundant memory cell 12. The local block 120 includes the corresponding 37 sense amplifiers 21 and 22. In other words, the memory cell array 110 has 37 columns in this example. One column (which is the left end column in FIG. 19) out of the 37 columns is for the redundant memory cells 12 and redundant sense amplifiers 22. In this example, a total of 37 redundant replacement circuits 251 are provided to each of the 37 columns as illustrated in FIG. 19.

Each of the redundant replacement circuits 251 has a circuit configuration illustrated in FIG. 20. The redundant replacement circuit 251 has a NOR element NO1, inverters INV1 and INV2, and NAND elements NA1 to NA6. In order to perform a redundant replacement, 1 bit of the redundant select signal Dec_data_in_xx (also called Dec_D_xx or Dec_D_n) has a value of "1", as described above. The redundant replacement circuit 251 evaluates both data of write data Write_Data_in_xx (also called WD_xx or WD_n) and the redundant select signal Dec_data_in_xx. Then, the redundant replacement circuit 251 outputs the write data WD_out_xx and XWD_out_xx and a judgment signal Judge_xx. The write data Write_Data_in_xx are sequentially transferred to the left in FIG. 19 in the 37 redundant select circuits 251 as WD_inout_xx and XWD_inout_xx. The redundant select signal Dec_data_in_xx is sequentially transferred as Red_D_xx to the left in FIG. 19 in the 37 redundant select circuits 251. The memory cells 11 and sense amplifier 21 in the column with the judgment signal Judge_xx having a value of "0" are determined as the target of the redundant replacement. Then, the memory cells 11 and sense amplifier 21 are replaced by the redundant memory cell 12 and redundant sense amplifier 22. In the memory cell array 110, write data WD are written in the row designated by the signal of the word line WL and the columns for 36 bits excluding the bit of the memory cell 11 replaced as the target of the redundant replacement as described above.

The operations by the redundant replacement circuit 251 may be described in detail below.

If the redundant replacement circuit 251 belongs to the column being the target of the replacement, the redundant select signal Dec_D_xx (Dec_D_n in FIG. 20) has a value of "1". The signal is inverted by the inverter INV1 to a value "0". Then, the signal is output as a judgment signal Judge_n. If the judgment signal having a value of "0" is given to the NAND elements NAX and NAY in FIG. 19, the elements NAX and NAY functioning as gates close their gates. Thus, write data are not output to the memory cells 11 in the column. Therefore, writing is not performed on the memory cells 11 in the column to be replaced.

The redundant select signal Red_d_n−1 to be given to the redundant select circuit 251 has a value of "1" if the column on the right-hand side of the column to which the redundant replacement circuit 251 belongs is the target of the replacement. The element NO1 outputs a value "0" if one of the input redundant select signals Dec_D_n and Red_D_n−1 has a value of "1". The output value "0" is inverted by the inverter INV2 to a value "1" Then, the output value "0" is transferred as Red_D_n to the adjacent left-hand redundant select circuit 251.

If the element NO1 outputs a value "0" to the elements NA1 and NA2, the elements NA1 and NA2 functioning as gates close their gates and do not output write data WD_in_n and XWD_in_n to the memory cells 11 of the column. In other words, when one of the column itself and the adjacent right-hand columns is the target of the replacement, write data to be written to the column are not output to the memory cells 11 in the column. On the other hand, if the redundant select signal Red_D_n−1 having a value of "1" transferred from the adjacent right-hand column is input to the elements NA3 and NA4, the elements NA3 and NA4 functioning as gates open their gates. Thus, the write data WD_in_n−1 and XWD_in_n−1 to be written to the memory cells 11 in the adjacent right-hand column are output through the NAND elements NA5 and NA6 instead. In other words, if one of the column itself and the adjacent right-hand columns is the target of the replacement, the write data to be written to the adjacent right-hand column is output to the memory cells 11 in the column.

On the other hand, if the elements NO1 outputs a value "1" to the elements NA1 and NA2, the elements NA1 and NA2 functioning as gates open their gates. Thus, the write data WD_in_n and XWD_in_n to be written to the memory cells 11 in the column are output through the NAND elements NA5 and NA6. In other words, if one of the column itself and the adjacent right-hand columns is not the target of the replacement, the write data to be written to the column is output to the memory cells 11 in the column. On the other hand, if the redundant select signal Red_D_n−1 transferred from the adjacent right-hand column and having a value of "0" is input to the elements NA3 and NA4, the elements NA3 and NA4 functioning as gates close their gates. Thus, the write data WD_in_n−1 and XWD_in_n−1 to be written to the memory cells 11 in the adjacent right-hand column are not output. In other words, if one of the column itself and the adjacent right-hand columns is not the target of the replacement, the write data to be written to the adjacent right-hand column are not output to the memory cells 11 in the column.

In this way, with the redundant select circuit 251, if one of the column itself and the adjacent right-hand columns is the target of the replacement in columns of the memory cell arrays 110, write data to be written to the column are sequentially output to the memory cells 11 in the adjacent left-hand column. On the other hand, if one of the column itself and the adjacent right-hand columns is not the target of the replacement, write data to be written to the column is directly output to the memory cells 11 in the column. As a result, to the right columns of the column to be replaced, the write data WD to be written to the column are directly and normally written to the memory cells 11 in the columns. On the other hand, to the column to be replaced and the left columns, the write data WD to be written to the adjacent right-hand column are written to the memory cells 11 in the columns. In this way, data are not written to the memory cells 11 in the column to be replaced. The data to be written to the memory cells 11 in the left columns of the column to be replaces are written to the memory cells 11 in the left columns sequentially shifted by one. Thus, the redundant replacement may be implemented.

Figure 21:
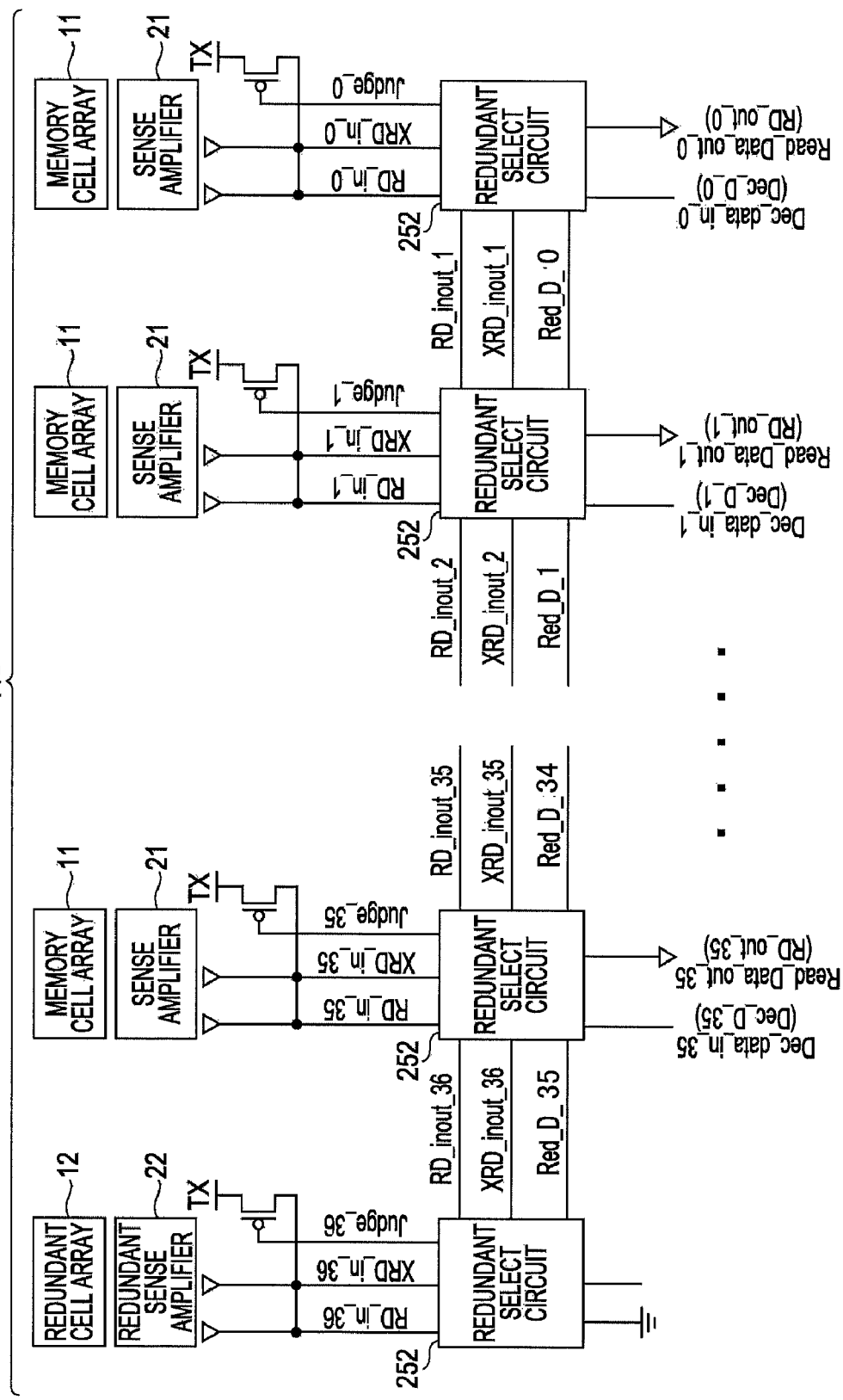
FIG. 21 is a circuit diagram illustrating redundant select circuits (in reading) and the vicinity in a semiconductor memory according to an embodiment.

FIG. 21 illustrates an example of a circuit that performs a redundant replacement on a memory cell 11 and sense amplifier 21 for one bit of a failed (or defective) part by a redundant memory cell 12 and redundant sense amplifier 22 on the basis of the redundant select signal Dec_data_in_xx output from the decoder 203 in data reading. The circuit is also included in the data path 130 of the SRAM macro. In this example, Read_Data_in_xx and XRead_Data_in_xx (also called RD_in_xx and XRD_in_xx, respectively) that are read data RD for 37 bits are input. Each of the rows of the memory cell array 110 includes one redundant memory cell 12 and 36 normal memory cells. The local block 120 includes the corresponding 37 sense amplifiers 21 and 22. In other words, in this example, the memory cell array 110 has 37 columns. One column (which is the left end column in FIG. 21) out of the 37 columns has the redundant memory cells 12 and redundant sense amplifiers 22. Also in this example, as illustrated in FIG. 21, a total of 37 redundant replacement circuits 252 are provided to each of the 37 columns.

Figure 22:
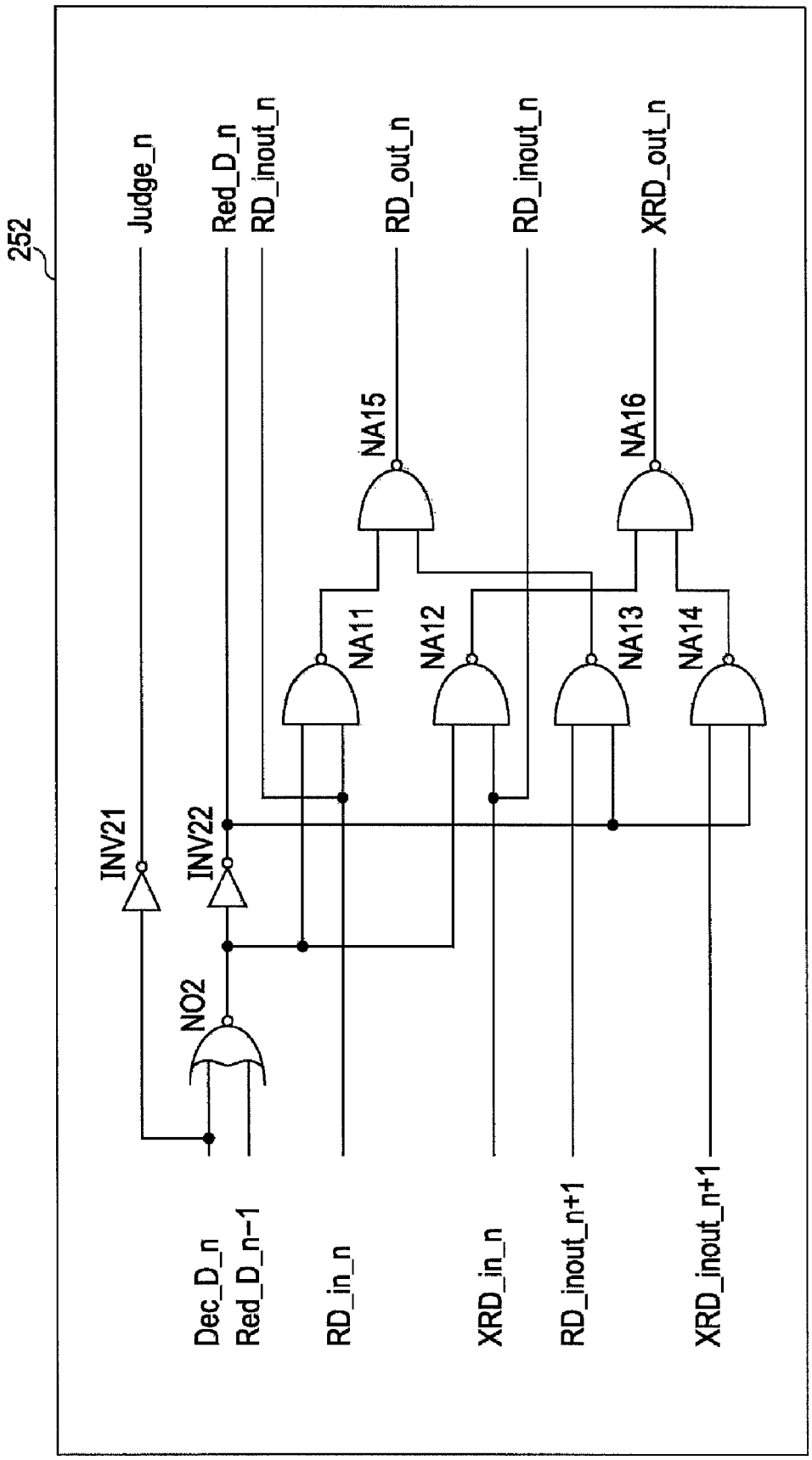
FIG. 22 is a circuit diagram illustrating a redundant select circuits (in reading) and the vicinity in a semiconductor memory according to an embodiment.

Each of the redundant replacement circuits 252 has a circuit configuration illustrated in FIG. 22. The redundant replacement circuit 252 has a NOR element NO2, inverters INV21 and INV22, and NAND elements NA11 to NA16. In order to perform a redundant replacement, 1 bit of the redundant select signal Dec_data_in_xx (also called Dec_D_xx) has a value of "1", as described above. The redundant replacement circuit 252 evaluates both data of read data Read_Data_in_xx and XRead_Data_in_xx (also called RD_in_xx or XRD_in_xx) and the redundant select signal Dec_data_in_xx. Then, the redundant replacement circuit 252 outputs the read data RD_out_xx and XWD_out_xx and a judgment signal Judge_xx. The read data Read_Data_in_xx and XRead_Data_in_xx are sequentially transferred to the right in FIG. 21 in the 37 redundant select circuits 252 as RD_inout_xx and XRD_inout_xx. The redundant select signal Dec_data_in_xx is sequentially transferred as Red_D_xx to the left in FIG. 19 in the 37 redundant select circuits 252.

In the column with the judgment signal Judge_xx having a value of "0", the memory cells 11 and sense amplifier 21 in the column are determined as the target of the redundant replacement. Then, the column is replaced by the column of the redundant memory cell 12 and redundant sense amplifier 22. In the memory cell array 110, read data RD are retrieved in intersections of the row designated by the signal of the word line WL and the 36 columns for 36 bits excluding the bit of the column replaced as the target of the redundant replacement as described above.

The operations by the redundant replacement circuit 252 may be described in detail below. If the column that the redundant replacement circuit 252 belongs to is the column being the target of the replacement, the redundant select signal Dec_D_xx (Dec_D_n in FIG. 22) has a value of "1". The signal is inverted by the inverter INV21 to a value "0". Then, the signal is output as a judgment signal Judge_n. The judgment signal having a value of "0" controls the transistor TX.

Then, the read signals RD_in_n and XRD_in_n involved in the column become high. Thus, the read data from the memory cells 11 in the column are not output. Therefore, the data are not retrieved from the memory cells 11 in the column being the target of the replacement.

The redundant select signal Red_d_n−1 to be given from the adjacent right-hand redundant select circuit 252 has a value of "1" if the column on the right-hand side of the column to which the redundant replacement circuit 252 belongs is the target of the replacement. The element NO2 outputs a value "0" if one of the input redundant select signals Dec_D_n and Red_D_n−1 has "1". The output value "0" is inverted by the inverter INV22 to a value "1". Then, the output value is transferred as Red_D_n to the adjacent left-hand redundant select circuit 252. If the element NO2 outputs a value "0" to the elements NA11 and NA12, the elements NA11 and NA12 functioning as gates close their gates. Then, the elements NA11 and NA12 do not handle the read data RD_in_n and XRD_in_n retrieved from the memory cells 11 of the column as the output RD_out_xx and XRD_out_xx of the column. In other words, when one of the column itself and the adjacent right-hand columns is the target of the replacement, read data from the memory cells 11 in the column are not output as the output RD_out_xx and XRD_out_xx. If the redundant select signal Red_D_n−1 having a value of "1" transferred from the adjacent right-hand column is input to the elements NA13 and NA14, the elements NA13 and NA14 functioning as gates open their gates. Thus, the read data RD_in_n+1 and XRD_in_n+1 retrieved from the memory cells 11 in the immediate left column are output through the NAND elements NA15 and NA16 instead. In other words, if one of the column itself and the adjacent right-hand columns is the target of the replacement, the read data from the immediate left column is output to the memory cells 11 in the column.

On the other hand, if the elements NO2 outputs a value "1" to the elements NA11 and NA12, the elements NA11 and NA12 functioning as gates open their gates. Thus, the read data RD_in_n and XRD_in_n retrieved from the memory cells 11 in the column are output through the NAND elements NA15 and NA16. In other words, if one of the column itself and the adjacent right-hand columns is not the target of the replacement, the read data from the memory cells 11 in the column are directly output. If the redundant select signal Red_D_n−1 transferred from the immediate right column and having "0" is input to the elements NA13 and NA14, the elements NA13 and NA14 functioning as gates close their gates. Thus, the read data RD_in_n+1 and XRD_in_n+1 retrieved from the memory cells 11 in the immediate left column are not output. In other words, if one of the column itself and the adjacent right-hand columns is not the target of the replacement, the read data from the memory cells 11 in the immediate left column are not output.

In this way, with the redundant select circuit 252, if one of the column itself and the adjacent right-hand columns is the target of the replacement in columns of the memory cell arrays 110, read data retrieved from the memory cells 11 in the immediately left column are output. On the other hand, if one of the column itself and the adjacent right-hand columns is not the target of the replacement, read data retrieved from the memory cells 11 in the column are directly output. As a result, to the right-hand columns of the column to be replaced, the read data retrieved from the memory cells 11 in the columns are directly and normally output. On the other hand, to the column to be replaced and the left-hand columns, the read data retrieved from the memory cells 11 in the immediate left columns are output. In this way, read data retrieved from the memory cells 11 in the column to be replaced are not output. The read retrieved from the memory cells 11 in the left-hand columns of the column to be replaced are output from the memory cells 11 in the left columns sequentially shifted by one. Thus, the redundant replacement may be implemented.

Figure 23:
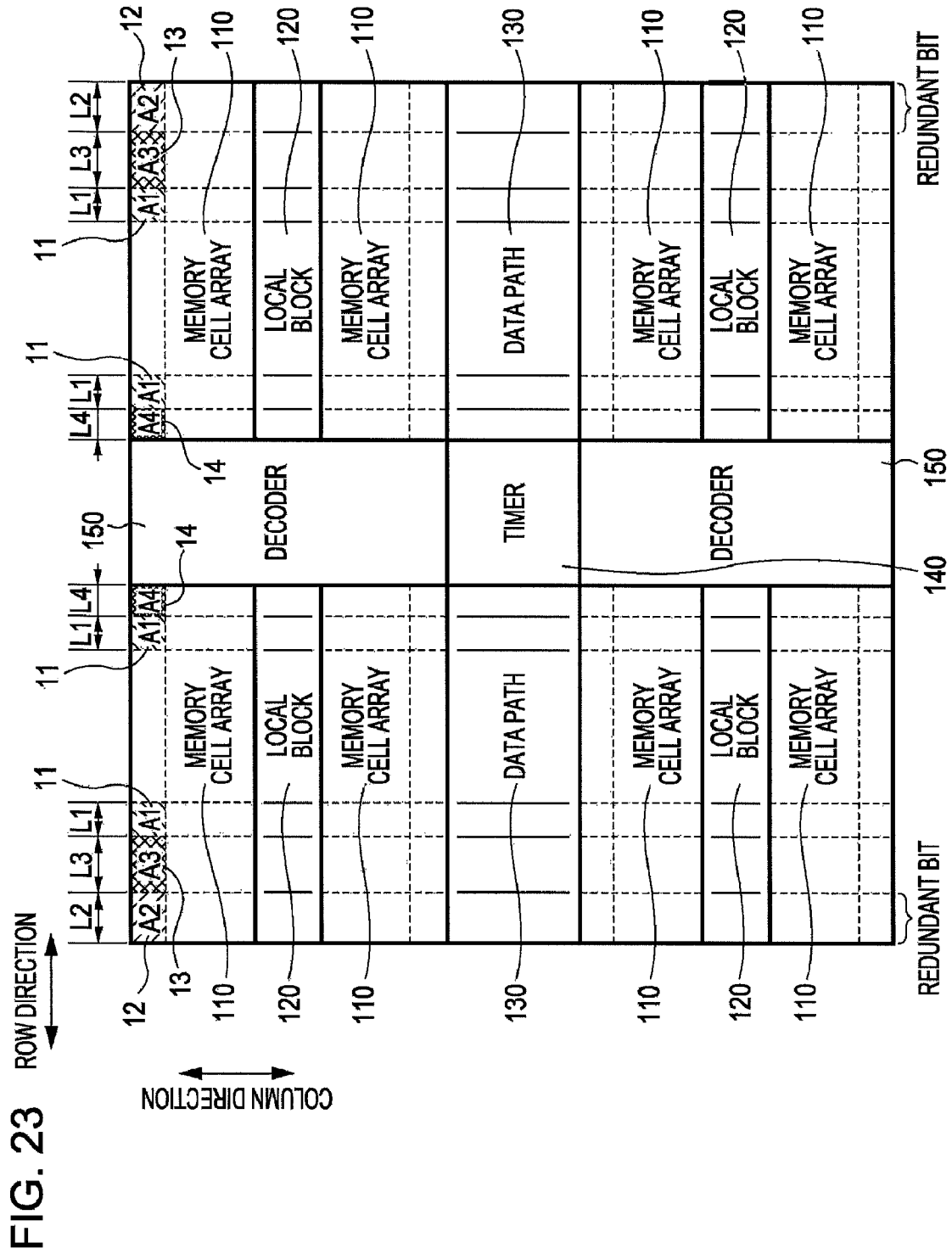
FIG. 23 is a schematic layout diagram of a semiconductor memory according to another embodiment.

According to the second embodiment in FIG. 3, the end memory cells 13 and end amplifiers 23 have a larger area than normal memory cells 11 and normal sense amplifiers 21. However, the configurations of the end memory cells and end amplifiers are not limited to the configuration. According to another embodiment, the end memory cells and end amplifiers may have a smaller area than normal memory cells and normal sense amplifiers. According to the embodiment, for example, as illustrated in FIG. 23, the memory cells in the column neighboring to the decoders 150 may be handled as end memory cells 14. The length L4 and area A4 in the row direction may be smaller than the length L1 and area A1 of the normal memory cells 11. This allows a lower performance of the end memory cells 14 than the normal memory cells 11. Similarly, the sense amplifier (not illustrated) in the column may be handled as an end amplifier, and its length and area in the row direction may be smaller than a normal sense amplifier. This allows a lower sensitivity than a normal sense amplifier.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments of the present invention have been described in detail, it should be understood that the various changes, substitutions, and alterations could be made hereto without departing from the spirit and scope of the invention.

What is claimed is:

1. A semiconductor storage device comprising:
   a memory cell array that stores data and includes a plurality of memory cells two dimensionally arrayed on row and column lines extending along row and column directions, at least one of the memory cells assigned to a redundant memory cell having a larger area size than the other memory cells, the plurality of memory cells and at least one of the redundant memory cells arrayed on at least one of the row lines; and
   a plurality of sense amplifiers that amplify a first output signal from the memory cells, at least one of the sense amplifiers arrayed on the respective column lines, at least one of the sense amplifiers assigned to a redundant sense amplifier that amplifies a second output signal from the redundant memory cell having a larger area size than the other sense amplifiers, the plurality of sense amplifiers and at least one of the redundant sense amplifiers arrayed on at least one of the row lines.

2. The semiconductor storage device according to claim 1, wherein
   a length of the one of the memory cells assigned to the redundant memory cell along the row direction is greater than each of lengths of the other memory cells along the row direction, and
   a length of the one of sense amplifiers assigned to the redundant sense amplifiers along the row direction is greater than each of lengths of the other sense amplifiers along the row direction.

3. The semiconductor storage device according to claim 2, wherein
   a length of the one of the memory cells assigned to the redundant memory cell along the column direction is substantially equal to each of lengths of the other memory cells along the column direction, and
   a length of each of the other memory cells arrayed on the same column line along the row direction is substantially equal to a length of the other sense amplifiers along the row direction.

4. The semiconductor storage device according to claim 1, wherein
   a gate width of a transistor included in the one of the memory cells assigned to the redundant memory cell is greater than a gate width of a transistor being included in the other memory cells along the row direction.

5. The semiconductor storage device according to claim 1, wherein
   a plurality of transistors included in the one of the sense amplifier assigned to the redundant sense amplifier are disposed in parallel along the row direction, and
   a number of the transistors included in the redundant sense amplifier is greater than a number of the transistors being included in the other sense amplifiers.

6. The semiconductor storage device according to claim 1, further comprising:
   a redundant cell replacement unit that replaces one of the other memory cells to the redundant memory cell arrayed on the same column line with the other memory cells; and
   a redundant amplifier selector that selects a signal outputted from a redundant sense amplifier amplifying an output signal from the redundant memory cell replaced from at least one of the other memory cells.

7. The semiconductor storage device according to claim 6, wherein
   the redundant cell replacement unit further includes a changer circuit that changes the other memory cells arrayed on the same column line in use to the other memory cells arrayed adjacent to the same column line when the redundant amplifier selector selects the signal outputted from a redundant sense amplifier.

8. A semiconductor storage device comprising:
   a memory cell array that stores data and includes a plurality of memory cells two dimensionally arrayed on row and column lines extending along row and column directions, at least one of the first memory cells assigned to redundant memory cells having a larger area size than the other memory cells, the plurality of memory cells and at least one of the first memory cells arrayed on at least one of the row lines, the one of the first memory cells being arrayed on at least one of the row end lines; and
   a plurality of sense amplifiers that amplify a first output signal from the memory cells, at least one of the sense amplifiers arrayed on the respective column lines; at least one of the sense amplifiers assigned to a first sense amplifier that amplifies a second output signal from the first memory cell having a larger area size than the other sense amplifiers, the plurality of sense amplifiers and at least one of the first sense amplifiers arrayed on at least one of the row lines, the one of the first sense amplifiers being arrayed on at least one of the row end lines.

9. The semiconductor storage device according to claim 8, wherein
   the first memory cell is assigned to a redundant memory cell, and
   the first sense amplifier is assigned to a redundant sense amplifier.

* * * * *